(12) United States Patent
Takada

(10) Patent No.: US 10,746,809 B2
(45) Date of Patent: Aug. 18, 2020

(54) PHYSICAL QUANTITY MEASUREMENT DEVICE, ELECTRONIC APPARATUS, AND VEHICLE

(71) Applicant: Seiko Epson Corporation, Tokyo (JP)

(72) Inventor: Yutaka Takada, Minamiminowa (JP)

(73) Assignee: Seiko Epson Corporation (JP)

( * ) Notice: Subject to any disclaimer, the term of this patent is extended or adjusted under 35 U.S.C. 154(b) by 139 days.

(21) Appl. No.: 16/142,170

(22) Filed: Sep. 26, 2018

(65) Prior Publication Data

US 2019/0094284 A1 Mar. 28, 2019

(30) Foreign Application Priority Data

Sep. 28, 2017 (JP) ................. 2017-187301

(51) Int. Cl.

| | |
|---|---|
| *G01C 19/5607* | (2012.01) |
| *G01C 19/5628* | (2012.01) |
| *G01R 31/50* | (2020.01) |
| *G01C 19/5614* | (2012.01) |
| *G06G 7/186* | (2006.01) |
| *G06F 7/62* | (2006.01) |
| *H03K 5/24* | (2006.01) |
| *H03F 3/45* | (2006.01) |
| *G01P 3/44* | (2006.01) |

(Continued)

(52) U.S. Cl.

CPC ......... *G01R 31/50* (2020.01); *G01C 19/5614* (2013.01); *G06F 7/62* (2013.01); *G06G 7/186* (2013.01); *H03F 3/45* (2013.01); *H03K 5/24* (2013.01); *G01P 3/44* (2013.01); *G01P 21/02* (2013.01); *H03H 9/19* (2013.01)

(58) Field of Classification Search
CPC ................. G01L 19/003; G01L 19/147; Y10T 29/49103; Y10T 29/49774; Y10T 29/49927; Y10T 29/49918
See application file for complete search history.

(56) References Cited

U.S. PATENT DOCUMENTS

| | | | |
|---|---|---|---|
| 2001/0037683 A1 | 11/2001 | Nozoe et al. | |
| 2009/0205421 A1 | 8/2009 | Naruse et al. | |

(Continued)

FOREIGN PATENT DOCUMENTS

| | | |
|---|---|---|
| JP | 08-327363 A | 12/1996 |
| JP | 2000-171257 A | 6/2000 |

(Continued)

*Primary Examiner* — Brandi N Hopkins
(74) *Attorney, Agent, or Firm* — Harness, Dickey & Pierce, P.L.C.

(57) ABSTRACT

A physical quantity measurement device includes a sensor element having a coupling capacitance formed between a drive electrode and a detection electrode, and a circuit device having a drive circuit adapted to supply a drive signal to the drive electrode, a detection circuit adapted to detect physical quantity information corresponding to a physical quantity based on a detection signal from the detection electrode, and a fault diagnosis circuit, and the fault diagnosis circuit has an electrostatic leakage component extraction circuit adapted to extract an electrostatic leakage component due to the coupling capacitance from one of the detection signal and an amplified signal of the detection signal, and performs a fault diagnosis based on the electrostatic leakage component extracted.

20 Claims, 14 Drawing Sheets

(51) Int. Cl.
*H03H 9/19* (2006.01)
*G01P 21/02* (2006.01)

(56) References Cited

U.S. PATENT DOCUMENTS

| | | | |
|---|---|---|---|
| 2010/0011834 A1 | 1/2010 | Sato | |
| 2014/0318244 A1* | 10/2014 | Tsutsumi | G01C 19/5776 |
| | | | 73/504.12 |
| 2018/0274921 A1* | 9/2018 | Matsukawa | G01C 19/5614 |

FOREIGN PATENT DOCUMENTS

| | | |
|---|---|---|
| JP | 2005-249395 A | 9/2005 |
| JP | 2009-186305 A | 8/2009 |
| JP | 2010-025695 A | 2/2010 |
| JP | 2010-043962 A | 2/2010 |
| JP | 2011-257428 A | 12/2011 |

\* cited by examiner

PHYSICAL QUANTITY MEASUREMENT DEVICE, ELECTRONIC APPARATUS, AND VEHICLE

CROSS-REFERENCE

The entire disclosure of Japanese Patent Application No. 2017-187301, filed Sep. 28, 2017 is expressly incorporated by reference herein.

BACKGROUND

1. Technical Field

The present invention relates to a physical quantity measurement device, an electronic apparatus, a vehicle, and so on.

2. Related Art

In the past, there has been known a physical quantity measurement device for detecting a physical quantity based on a detection signal from a sensor element. Taking a gyro sensor as an example, the physical quantity measurement device detects an angular velocity or the like as a physical quantity. The gyro sensor is incorporated in an electronic apparatus such as a digital camera or a smartphone, or a vehicle such as a car or a plane, and there is performed image stabilization, attitude control, GPS autonomous navigation, or the like using the physical quantity such as an angular velocity thus detected.

As a fault diagnosis method in such a physical quantity measurement device, there is known the related art disclosed in, for example, JP-A-8-327363 (Document 1), JP-A-2000-171257 (Document 2), JP-A-2010-25695 (Document 3) and JP-A-2010-43962 (Document 4). In Document 1, a mechanical coupling signal caused by mechanical coupling between a sensing plate (a detection element) and a drive plate (a drive element) of a sensor element is detected by a detector to thereby realize the fault diagnosis. Similarly in Document 2, the fault diagnosis is realized by a vibrator monitoring a self-vibration component (leakage vibration) generated by the vibrator itself excited. In Document 3, by extracting the self-vibration component and performing a temperature correction using a temperature characteristic correction device, the fault diagnosis high in accuracy is realized. In Document 4, in a fault diagnosis mode, a provisional angular velocity signal different in frequency from the drive signal is generated, the provisional angular velocity signal thus generated is superimposed on the drive signal, and the result is then supplied to a drive electrode of the vibrator. Then, a provisional angular velocity detection signal is generated based on a signal formed of the provisional angular velocity signal propagated to a detection electrode via an electrostatic coupling capacitance between the drive electrode and the detection electrode of the vibrator to realize the fault diagnosis.

However, the method using a vibration leakage component (the self-vibration component, the mechanical coupling signal) for the fault diagnosis of the physical quantity measurement device is apt to be affected by an individual variation of the sensor element, and the determination accuracy of the fault diagnosis tends to degrade. Further, in the sensor element having a little vibration leakage component in structure, it is necessary to accurately elaborate the desired vibration leakage component using a trimming technology or the like in order to make the reliable fault diagnosis. Further, in order to electrically extract the vibration leakage component, a synchronous detection circuit for detecting the vibration leakage component is necessary in addition to the circuit for detecting the Coriolis force, and therefore, the chip size grows to hinder the miniaturization and the reduction in cost of the product. In Document 4 described above, for example, it becomes necessary to additionally generate a signal for the fault diagnosis, and it is determined that a fault has occurred due to a failure of a generation circuit of the signal or a superimposing circuit. Therefore, it is difficult to reliably determine the fault in a drive channel and a detection channel.

SUMMARY

An advantage of some aspects of the invention is to solve at least a part of the problems described above, and the invention can be implemented as the following embodiments or forms.

An aspect of the invention relates to a physical quantity measurement device including a sensor element having a drive electrode and a detection electrode, and provided with a coupling capacitance formed between the drive electrode and the detection electrode, and a circuit device having a drive circuit adapted to supply a drive signal to the drive electrode, a detection circuit adapted to detect physical quantity information corresponding to a physical quantity based on a detection signal from the detection electrode, and a fault diagnosis circuit, wherein the fault diagnosis circuit has an electrostatic leakage component extraction circuit adapted to extract an electrostatic leakage component due to the coupling capacitance from one of the detection signal and an amplified signal of the detection signal, and performs a fault diagnosis based on the electrostatic leakage component extracted.

In this aspect of the invention, when the drive circuit drives the drive electrode of the sensor element with the drive signal, the electrostatic leakage component of the drive signal is propagated toward the detection signal due to the coupling capacitance formed between the drive electrode and the detection electrode. Then, the electrostatic leakage component extraction circuit provided to the fault diagnosis circuit extracts the electrostatic leakage component from the detection signal or the amplified signal of the detection signal. Then, the fault diagnosis circuit makes the fault diagnosis of the physical quantity measurement device based on the electrostatic leakage component thus extracted. As described above, in this aspect of the invention, the fault diagnosis is made using the electrostatic leakage component caused by the coupling capacitance between the drive electrode and the detection electrode. The electrostatic leakage component corresponds to the coupling capacitance determined from the structure of the drive electrode and the detection electrode, and so on, and therefore becomes difficult to be affected by the individual variation of the sensor element, and thus, it is possible to increase the determination accuracy of the fault diagnosis. Further, since the fault diagnosis is made using the detection signal or the amplified signal of the detection signal, it becomes possible to realize the fault diagnosis with a smaller-scale and simplified circuit configuration.

In the aspect of the invention, the drive circuit may output the drive signal as a rectangular wave, and the electrostatic leakage component extraction circuit may extract a change of one of the detection signal and the amplified signal due to one of a rising edge and a falling edge of the drive signal as the rectangular wave as the electrostatic leakage component.

By performing the driving with the drive signal as the rectangular wave as described above, it becomes possible to increase the variation width of the voltage level due to the electrostatic leakage component, and it becomes possible to improve the determination accuracy of the fault diagnosis compared to the case of using the drive signal as a sinusoidal wave.

In the aspect of the invention, the electrostatic leakage component extraction circuit may have a differentiation circuit to which one of the detection signal and the amplified signal is input, and extract the electrostatic leakage component using the differentiation circuit.

By using such a differentiation circuit, it becomes possible to extract the pulse signal appearing in the output signal of the differentiation circuit as the electrostatic leakage component, and it becomes possible to realize the fault diagnosis higher in determination accuracy.

In the aspect of the invention, the fault diagnosis circuit may include a crest value conversion circuit adapted to convert a crest value of a pulse signal as an output signal of the differentiation circuit to output a conversion voltage, and a determination circuit adapted to make a comparative determination between the conversion voltage from the crest value conversion circuit and a threshold voltage to make a determination of the fault diagnosis.

According to this configuration, it becomes possible to realize the fault diagnosis using a simplified determination process of converting the crest value of the pulse signal corresponding to the electrostatic leakage component into the conversion voltage, and then comparing the conversion voltage and the threshold voltage with each other.

In the aspect of the invention, the fault diagnosis circuit may include a counter circuit adapted to perform a count process of the pulse signal as the output signal of the differentiation circuit, and a determination circuit adapted to make a determination of the fault diagnosis based on a count value of the counter circuit.

According to this configuration, it becomes possible to realize the determination process of the fault diagnosis using the electrostatic leakage component with a simplified circuit configuration of performing the count process of the pulse signal appearing in the output signal of the differentiation circuit.

In the aspect of the invention, the fault diagnosis circuit may make the fault diagnosis in a detection period in which the detection circuit detects the physical quantity information.

According to this configuration, it becomes possible to realize the constant fault diagnosis or the like for, for example, constantly checking whether or not the physical quantity measurement device is operating normally.

In the aspect of the invention, the sensor element may include a base section, a drive arm and a detection arm, the base section may be provided with a driving terminal and a detecting terminal, and a dielectric body may be disposed so as to cover the driving terminal and the detecting terminal of the base section.

By providing such a dielectric body, it is possible to increase the capacitance value of the coupling capacitance formed between the drive electrode and the detection electrode, and it is possible to increase the electrostatic leakage component, and therefore, it becomes possible to realize the fault diagnosis high in determination accuracy.

In the aspect of the invention, a first detection signal and a second detection signal as the detection signal may be input to the detection circuit, and the fault diagnosis circuit may perform the fault diagnosis based on one of the first and second detection signals and first and second amplified signals as amplified signals of the first and second detection signals.

According to this configuration, it becomes possible to appropriately detect the occurrence of the fault not only in the case in which the fault occurs in both of the detection channels of the first and second detection signals, but also in the case in which the fault occurs only in one of the detection channels of the first and second detection signals.

In the aspect of the invention, the detection circuit may include a first charge-voltage conversion circuit adapted to amplify the first detection signal to output a first amplified signal, and a second charge-voltage conversion circuit adapted to amplify the second detection signal to output a second amplified signal, and the electrostatic leakage component extraction circuit may extract the electrostatic leakage component of the first and second amplified signals from the first and second charge-voltage conversion circuit.

If using the first and second amplified signals from the first and second charge-voltage conversion circuits as described above, since it becomes possible to extract the leakage component in the state in which the electrostatic leakage component is amplified, it is possible to achieve the improvement in determination accuracy of the fault diagnosis compared to the case of using the first and second detection signals.

In the aspect of the invention, the detection circuit may include a differential amplifier adapted to perform differential amplification of the first and second amplified signals input to the fault diagnosis circuit, and a synchronous detection circuit adapted to perform synchronous detection based on a signal having been differentially amplified by the differential amplifier.

According to this configuration, since it becomes possible to perform the synchronous detection while canceling out the leakage signal (the electrostatic leakage component) due to the coupling capacitance between the drive electrode and the detection electrode used for the fault diagnosis using the differential amplification, it becomes possible to improve the accuracy of the fault diagnosis while achieving the improvement of the detection accuracy.

Another aspect of the invention relates to an electronic apparatus including any one of the physical quantity measurement devices described above.

Still another aspect of the invention relates to a vehicle including any one of the physical quantity measurement devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the measures for solving the problem of the invention.

1. Physical Quantity Measurement Device

Figure 1:
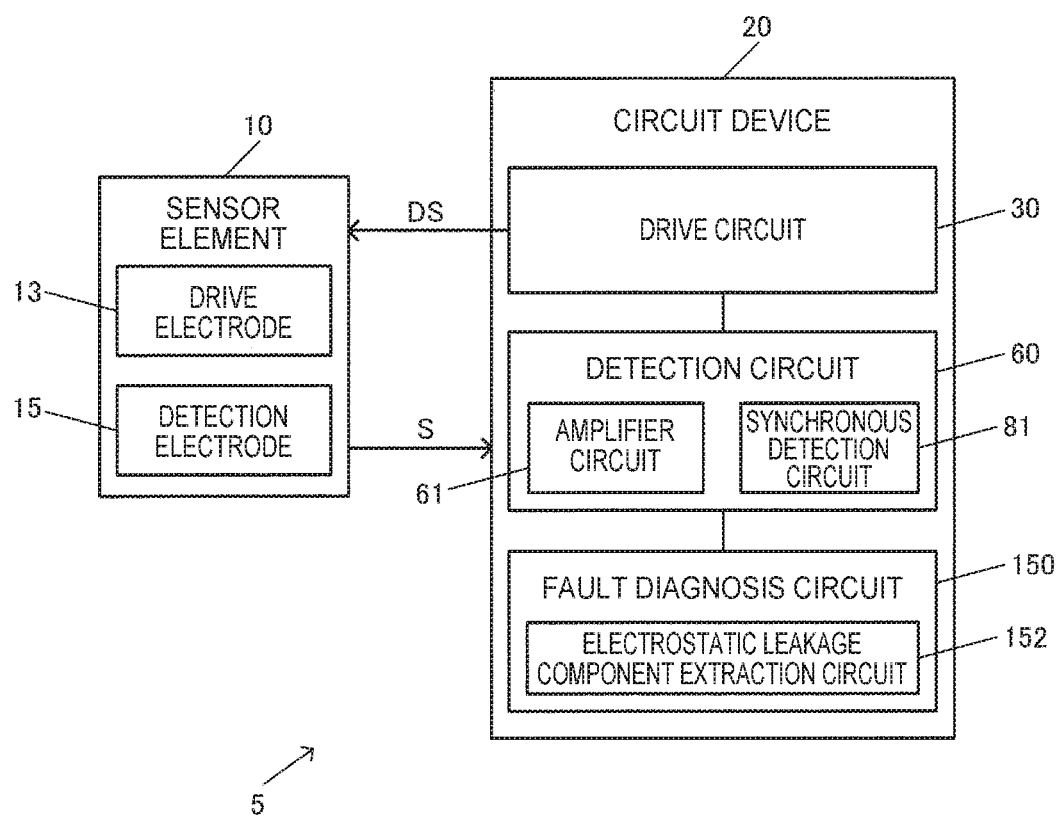
FIG. 1 is a diagram showing a configuration example of a physical quantity measurement device according to an embodiment of the invention.

FIG. 1 shows a configuration example of the physical quantity measurement device 5 according to the present embodiment. The physical quantity measurement device 5 (a physical quantity detection device, a sensor device) includes a sensor element 10 and a circuit device 20. It should be noted that the configuration of the physical quantity measurement device 5 is not limited to the configuration shown in FIG. 1, but it is possible to adopt a variety of practical modifications such as elimination of some of the constituents or addition of other constituents.

The sensor element 10 (a physical quantity transducer, a vibrator) is an element for detecting a physical quantity. For example, the sensor element 10 has a vibrator element (a vibrator), and the physical quantity is detected using a vibration of the vibrator element. For example, in the case in which the sensor element 10 is a gyro sensor element, an angular velocity is detected as the physical quantity. It should be noted that the physical quantity detected by the sensor element 10 can be a physical quantity (e.g., acceleration, angular acceleration, speed, moving distance, or pressure) other than the angular velocity.

The sensor element 10 has drive electrode 13 and detection electrode 15, and coupling capacitance (electrostatic coupling capacitance) is formed between the drive electrode 13 and the detection electrode 15. For example, coupling capacitance due to parasitic capacitance is formed (configured) between the drive electrode 13 and the detection electrode 15. The drive electrode 13 can be drive electrodes (driving conductive material patterns) provided to such drive arms 18A through 18D as explained with reference to FIG. 15 described later, or can also be driving interconnections (drive interconnection conductive material patterns) connected to the drive electrodes. The detection electrode 15 can be detection electrodes (detecting conductive material pattern) provided to detection arms 19A, 19B, or can also be detecting interconnections (detection interconnection conductive material patterns) connected to the detection electrodes.

The circuit device 20 includes a drive circuit 30, a detection circuit 60 and a fault diagnosis circuit 150. The drive circuit 30 supplies the drive electrode 13 of the sensor element 10 with a drive signal DS. The vibrator element of the sensor element 10 vibrates due to, for example, the drive signal DS supplied to the drive electrode 13. The detection circuit 60 detects physical quantity information (e.g., an angular velocity or acceleration) corresponding to the physical quantity based on a detection signal S from the detection electrode 15 of the sensor element 10. The vibrator element of the sensor element 10 vibrates due to, for example, the drive signal DS, and thus, the detection signal S as a current signal or a voltage signal is output from the detection electrode 15. The detection circuit 60 detects a desired wave (e.g., a Coriolis force signal) corresponding to the physical quantity based on the detection signal S to thereby detect the physical quantity information. For example, the detection circuit 60 has an amplifier circuit 61 and a synchronous detection circuit 81. The amplifier circuit 61 performs signal amplification of the detection signal S, and the synchronous detection circuit 81 performs synchronous detection based on a signal obtained by the amplification by the amplifier circuit 61 to detect the desired wave.

The fault diagnosis circuit 150 (an abnormal diagnosis circuit) is a circuit for performing the fault diagnosis (a diagnosis of an abnormal state) of the physical quantity measurement device 5. Specifically, the fault diagnosis circuit 150 has an electrostatic leakage component extraction circuit 152. The electrostatic leakage component extraction circuit 152 extracts an electrostatic leakage component due to the coupling capacitance between the drive electrode 13 and the detection electrode 15 from the detection signal S or an amplified signal of the detection signal S. Specifically, in the present embodiment, the electrostatic leakage component of the drive signal DS via the coupling capacitances propagates to the detection signal S, and the electrostatic leakage component extraction circuit 152 extracts the electrostatic leakage component. Then, the fault diagnosis circuit 150 performs the fault diagnosis based on the electrostatic leakage component extracted by the electrostatic leakage component extraction circuit 152. Here, the amplified signal of the detection signal S is the detection signal having been amplified by the amplifier circuit 61. The detection signal S or the amplified signal of the detection signal S is a signal which has not yet been synchronously detected by the synchronous detection circuit 81. Therefore, the fault diagnosis circuit 150 makes the determination of the fault diagnosis not based on the signal having synchronously been detected, but based on the signal having not yet been synchronously detected as the detection signal S or the amplified signal of the detection signal S.

Figure 2:
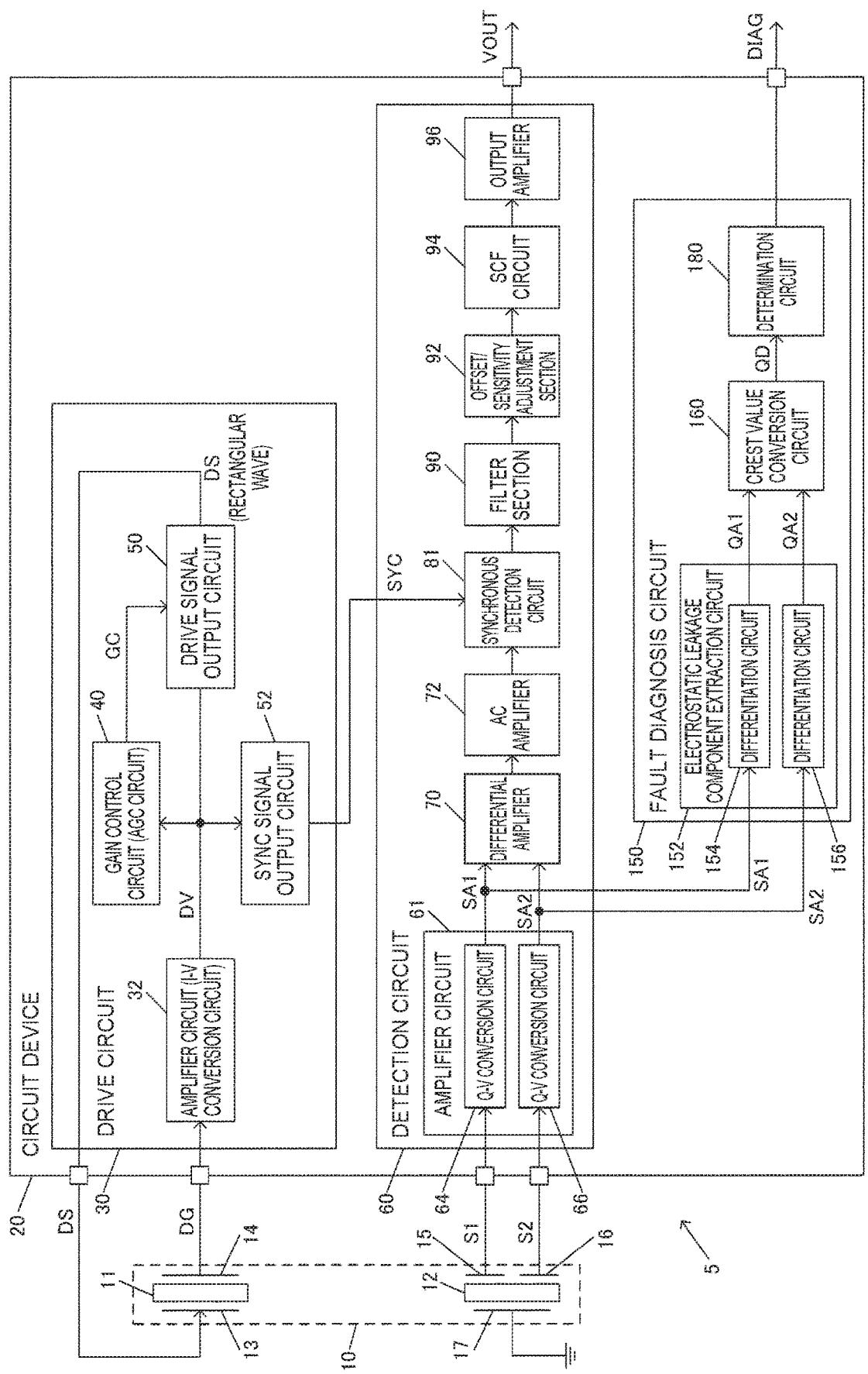
FIG. 2 is a diagram showing a detailed configuration example of the physical quantity measurement device.

FIG. 2 shows a detailed configuration example of the physical quantity measurement device 5 according to the present embodiment. The sensor element 10 has vibrator elements 11, 12, drive electrodes 13, 14, the detection electrodes 15, 16, and a ground electrode 17. The vibrator elements 11, 12 are each a piezoelectric type vibrator element formed of a thin plate of a piezoelectric material such as quartz crystal. Specifically, the vibrator elements 11, 12 are each a vibrator element formed of a Z-cut quartz crystal substrate. It should be noted that the piezoelectric material of the vibrator elements 11, 12 can also be a material such as ceramics or silicon other than quartz crystal.

The drive electrode 13 is supplied with the drive signal DS from the drive circuit 30, and thus, the vibrator element 11 for driving vibrates. The vibrator element 11 corresponds to, for example, drive arms 18A through 18D shown in FIG. 15 described later. Further, a feedback signal DG from the drive electrode 14 is input to the drive circuit 30. For example, the feedback signal DG due to the vibration of the vibrator element 11 is input to the drive circuit 30.

Further, the vibrator element 12 for detection vibrates due to the vibration of the vibrator element 11 for driving, and the charge (current) generated by the vibration is input from the detection electrodes 15, 16 to the detection circuit 60 as the detection signals S1, S2. Here, the ground electrode 17 is set to the ground potential (GND). The detection circuit 60 detects the physical quantity information (e.g., angular velocity) corresponding to the detection signals S1, S2 based on these detection signals S1, S2.

It should be noted that although the description will hereinafter be presented mainly taking the case in which the sensor element 10 is the gyro sensor element as an example, the present embodiment is not limited to this example, but the sensor element 10 can also be an element for detecting other physical quantities such as acceleration. Further, although such a double T-shaped vibrator element as shown in, for example, FIG. 15 described later can be used as the sensor element 10, a vibrator element of a tuning-fork type, an H-shape, or the like can also be used.

The drive circuit 30 includes an amplifier circuit 32 to which the feedback signal DG from the sensor element 10 is input, a gain control circuit 40 (an AGC circuit) for performing automatic gain control, and a drive signal output circuit 50 for outputting the drive signal DS to the sensor element 10. Further, the drive circuit 30 includes a sync signal output circuit 52 for outputting a sync signal SYC to the detection circuit 60. It should be noted that the configuration of the drive circuit 30 is not limited to FIG. 2, but a variety of practical modifications such as elimination of some of the constituents or addition of other constituents are possible.

The amplifier circuit 32 (an I/V conversion circuit) amplifies the feedback signal DG from the sensor element 10. For example, the amplifier circuit 32 converts the feedback signal DG of the current from the sensor element 10 into a voltage signal DV, and then outputs the voltage signal DV. The amplifier circuit 32 can be realized by an operational amplifier, a feedback resistor element, a feedback capacitor, and so on.

The drive signal output circuit 50 outputs the drive signal DS based on the signal DV having been amplified by the amplifier circuit 32. The gain control circuit 40 (AGC) outputs a control voltage GC to the drive signal output circuit 50 to control the amplitude of the drive signal DS. Specifically, the gain control circuit 40 monitors the signal DV to control the gain of the oscillation loop. For example, in the drive circuit 30, in order to keep the sensitivity of the sensor constant, it is necessary to keep the amplitude of the drive voltage supplied to the sensor element 10 (the vibrator element 11 for driving) constant. Therefore, the gain control circuit for automatically controlling the gain is disposed in the oscillation loop of a driving vibration system. The gain control circuit 40 automatically adjusts the gain in a variable manner so that the amplitude (the vibration velocity v of the vibrator element) of the feedback signal DG from the sensor element 10 becomes constant. The gain control circuit 40 can be realized by a full-wave rectifier for full-wave rectifying the signal DV from the amplifier circuit 32, an integrator for performing an integration process of an output signal of the full-wave rectifier, and so on.

For example, in the case in which the drive signal output circuit 50 outputs a rectangular-wave (or a sinusoidal) drive signal, the drive signal output circuit 50 can be constituted by a comparator, a buffer circuit, and so on. The comparator compares the voltage of the signal DV and a reference voltage (AGND) with each other. The buffer circuit buffers an output signal of the comparator, and then outputs the result as the drive signal DS. In this case, the buffer circuit outputs the drive signal DS which makes the control voltage GC from the gain control circuit 40 have a power supply voltage level (a high potential side power supply voltage). Thus, the amplitude of the drive signal DS as a rectangular-wave signal becomes to be controlled by the control voltage GC from the gain control circuit 40. For example, if the control voltage GC rises, the amplitude of the drive signal DS as a rectangular-wave signal increases, and if the control voltage GC drops, the amplitude of the drive signal DS decreases. If the rectangular-wave drive by the drive signal DS is performed in such a manner, since the rectangular-wave signal includes a frequency component in a wide range, a startup period of the oscillation of the physical quantity measurement device 5 can be shortened.

The sync signal output circuit 52 receives the signal DV having been amplified by the amplifier circuit 32, and then outputs the sync signal SYC (a reference signal) to the detection circuit 60. The sync signal output circuit can be realized by a comparator for performing a binarization process of the sinusoidal (alternating-current) signal DV to generate the rectangular-wave sync signal SYC, a phase adjustment circuit (a phase shifter) for performing a phase adjustment of the sync signal SYC, and so on.

The detection circuit 60 includes an amplifier circuit 61, a differential amplifier 70, an AC amplifier 72, a synchronous detection circuit 81, a filter section 90, an offset/sensitivity adjustment section 92, an SCF circuit 94, and an output amplifier 96. It should be noted that the configuration of the detection circuit 60 is not limited to FIG. 2, but a variety of practical modifications such as elimination of some of the constituents or addition of other constituents are possible. For example, the detection circuit 60 can be a digital circuit including an A/D conversion circuit. In this case, the offset adjustment and the sensitivity adjustment are realized by a digital signal processing section (DSP) disposed in the posterior stage of the A/D conversion circuit.

The amplifier circuit 61 receives a detection signal S1 and a detection signal S2 from the sensor element 10, and then performs charge-voltage conversion and signal amplification. The detection signals S1, S2 constitute differential signals. Specifically, the amplifier circuit (the detection circuit 60) includes a Q-V conversion circuit 64 (a first charge-voltage conversion circuit) for amplifying the detection signal S1 (a first detection signal) and a Q-V conversion circuit 66 (a second charge-voltage conversion circuit) for amplifying the detection signal S2 (a second detection signal). The differential amplifier 70 (a differential type amplifier circuit) performs differential amplification of differential amplified signals SA1, SA2 from the amplifier circuit 61 (the Q-V conversion circuits 64, 66). The AC amplifier 72 amplifies the output signal of the differential amplifier 70 to output the result to the synchronous detection circuit 81. An output signal of the AC amplifier 72 is input to the synchronous detection circuit 81, and thus, the synchronous detection circuit 81 performs the synchronous detection using the sync signal SYC from the drive circuit 30. For example, the synchronous detection circuit 81 performs the synchronous detection for extracting a desired wave from the detection signals S1, S2. The filter section 90 performs, for example, a low-pass filter process on the output signal of the synchronous detection circuit 81. The offset/sensitivity adjustment section 92 performs the offset adjustment (a zero-point correction process) and the sensitivity adjustment (a gain correction). The SCF circuit performs a filter process with a switched capacitor filter. The SCF circuit 94 performs a filter process for attenuating an unwanted signal which cannot completely be removed by, for example, the synchronous detection. The output signal of the SCF circuit 94 is input to the output amplifier 96, and then, the output amplifier 96 performs the signal amplification thereon to output a sensor output voltage VOUT. The sensor output voltage VOUT is a voltage in a voltage level corresponding to the physical quantity such as an angular velocity detected by, for example, the sensor element 10. It should be noted that in the case of using a digital type circuit having an A/D conversion circuit as the detection circuit 60, it results that the detection circuit 60 outputs digital sensor output data (e.g., angular velocity data) instead of the sensor output voltage VOUT.

As described above, in FIG. 2, the detection circuit 60 includes the differential amplifier 70 for performing the differential amplification of the amplified signals SA1, SA2 (the first and second amplified signals) input to the fault diagnosis circuit 150, and the synchronous detection circuit 81 for performing the synchronous detection based on the signal having been differentially amplified by the differential amplifier 70. According to this configuration, it becomes possible to cancel out the leakage signal (electrostatic leakage signal) due to the coupling capacitances between the drive electrode 13 and the detection electrodes 15, 16 used for the fault diagnosis with the differential amplification by the differential amplifier 70. For example, the electrostatic leakage signal (the electrostatic coupling leakage signal) as the unwanted signal in-phase with the sensor signal (the detection signal) can be removed. Further, since the synchronous detection by the synchronous detection circuit 81 is performed based on the signal in which the leakage signal due to the coupling capacitances has been canceled out, an improvement of the detection accuracy can be achieved. Further, since the fault diagnosis is performed using the amplified signals SA1, SA2 as the signals having not been synchronously detected, it becomes possible to achieve an improvement of the determination accuracy of the fault diagnosis. It should be noted that although in FIG. 2, there is adopted the configuration of disposing the AC amplifier 72 between the differential amplifier 70 and the synchronous detection circuit 81, it is also possible to omit the configuration of the AC amplifier 72 to input the output signal of the differential amplifier 70 to the synchronous detection circuit 81.

The fault diagnosis circuit 150 includes the electrostatic leakage component extraction circuit 152, a crest value conversion circuit 160, and a determination circuit 180. The electrostatic leakage component extraction circuit 152 includes differentiation circuits 154, 156. As described above, the detection signals S1, S2 are signal-amplified by the amplifier circuit 61. Further, the amplified signals SA1, SA2 of the detection signals S1, S2 are input to the differentiation circuits 154, 156. It should be noted that it is also possible to adopt a practical modification of inputting the detection signals S1, S2 to the differentiation circuits 154, 156. Further, the electrostatic leakage component extraction circuit 152 extracts a variation (a voltage variation) of the amplified signals SA1, SA2 (the detection signals S1, S2) due to a rising edge or a falling edge of the drive signal DS as a rectangular wave, for example, as the electrostatic leakage component of the sensor element 10 using the differentiation circuits 154, 156. As described above, the electrostatic leakage component extraction circuit 152 extracts the electrostatic leakage component using the differentiation circuits 154, 156. For example, the electrostatic leakage component extraction circuit 152 extracts the vibration leakage component using output signals QA1, QA2 of the differentiation circuits 154, 156.

The crest value conversion circuit 160 converts the crest values of the pulse signals of the output signals QA1, QA2 of the differentiation circuits 154, 156 to output a conversion voltage QD. For example, the crest value conversion circuit 160 outputs the conversion voltage QD increasing as the crest value (the amplitude of the pulse) increase. Then, the determination circuit 180 makes the comparative determination between the conversion voltage QD from the crest value conversion circuit 160 and the threshold voltage to thereby make the determination on the fault diagnosis.

Figure 3:
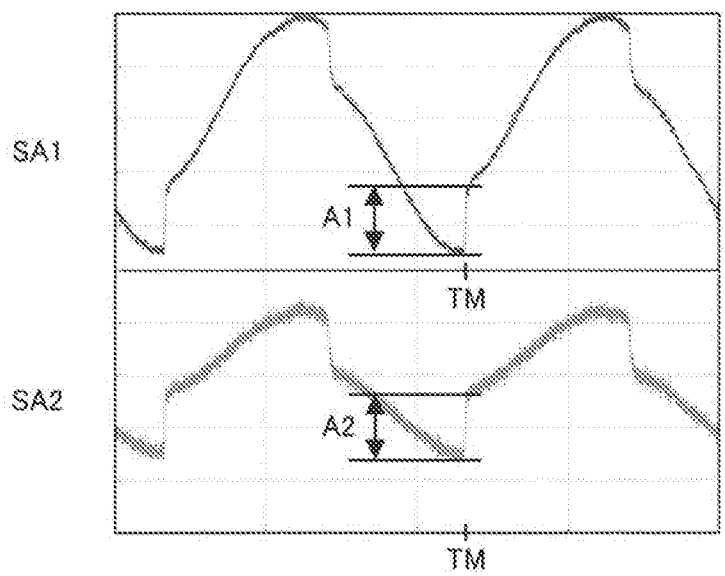
FIG. 3 is a signal waveform chart for explaining an operation of a fault diagnosis circuit.
Figure 4:
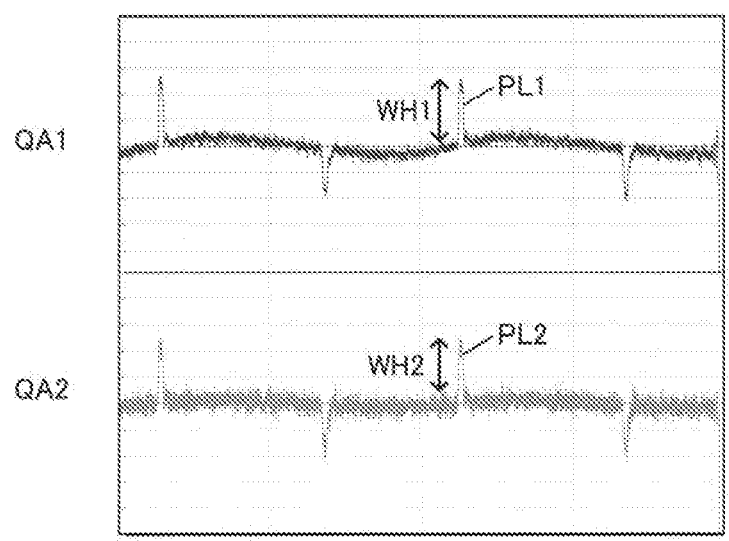
FIG. 4 is a signal waveform chart for explaining an operation of the fault diagnosis circuit.

FIG. 3 and FIG. 4 are each a signal waveform chart for explaining the operation of the fault diagnosis circuit 150. FIG. 3 shows an example of the signal waveforms of the amplified signals SA1, SA2 of the detection signals S1, S2 due to the amplifier circuit 61. In FIG. 3, the symbol TM corresponds to the timing of a rising edge (a falling edge) of the drive signal DS as a rectangular wave. As indicated by the symbols A1, A2 shown in FIG. 3, the amplified signals SA1, SA1 (the detection signals S1, S2) change significantly due to the rising edge (the falling edge) of the drive signal DS as a rectangular wave. The fault diagnosis circuit 150 extracts the changes of the amplified signals SA1, SA2 (the detection signals S1, S2) indicated by the symbols A1, A2 as the electrostatic leakage component. Specifically, the coupling capacitances are formed between the drive electrode 13 and the detection electrodes 15, 16 of the sensor element 10, and due to the coupling capacitances, the electrostatic leakage component of the sensor element 10 appears in the detection signals S1, S2 and the amplified signals SA1, SA2 of the detection signals S1, S2. For example, the changes of the voltage level as large steps indicated by the symbols A1, A2 shown in FIG. 3 appear in the amplified signals SA1, SA2. The fault diagnosis circuit 150 extracts the changes indicated by the symbols A1, A2 as the electrostatic leakage component.

Specifically, the differentiation circuits 154, 156 to which the amplified signals SA1, SA2 are input output the output signals QA1, QA2 shown in FIG. 4. Then, at the timing TM shown in FIG. 3, pulse signals PL1, PL2 appear in the output signals QA1, QA2 as shown in FIG. 4. The crest value conversion circuit 160 converts the crest values WH1, WH2 of the pulse signals PL1, PL2 to output the conversion voltage QD. For example, the crest value conversion circuit 160 outputs the conversion voltage QD so that the larger the changes in voltage level indicated by the symbols A1, A2 shown in FIG. 3 are, the lager the conversion voltage QD becomes. The determination circuit 180 makes the determination on the fault diagnosis based on the conversion voltage QD from the crest value conversion circuit 160 to output a fault diagnosis signal DIAG. Specifically, the determination circuit 180 makes the comparative determination between the conversion voltage QD and the threshold voltage to determine whether or not a fault exists in the physical quantity measurement device 5. For example, in the case in which the conversion voltage QD is lower than the threshold voltage, the determination circuit 180 determines that a fault exists, and outputs the fault diagnosis signal DIAG in, for example, a high level (a first voltage level).

For example, in Document 1 through Document 3 described above, the fault diagnosis is performed using the vibration leakage component also called a self-vibration component. The vibration leakage component is an unwanted component caused by the structure of the sensor element 10, and becomes an undesirable component when detecting the physical quantity such as an angular velocity.

Further, in the sensor element 10 having a double T-shaped structure shown in FIG. 15 described later, since there is adopted a configuration in which the drive arms 18A through 18D and the detection arms 19A, 19B are separated from each other, unwanted vibrations with respect to the detection arms 19A, 19B are difficult to occur. Further, since the sensor element 10 having the double T-shaped structure has a shape formed of drive systems arranged in a rotationally symmetric manner, it is possible to cancel out small vibrations leaked from the mutual drive systems. Therefore, the sensor element 10 having the double T-shaped structure has features that the unwanted vibration due to the vibration leakage component is difficult to occur, the structure is superior in an S/N ratio, the noise component is small, and the Coriolis force can sensitively be detected. Therefore, since the vibration leakage component is apt to become small, in the method of using the vibration leakage component, there is a problem that the appropriate fault diagnosis cannot be realized.

Further, in the fault diagnosis circuit of the related art example in which the fault diagnosis is performed using the vibration leakage component, it becomes necessary to provide a synchronous detection circuit for detecting the vibration leakage component separately from the synchronous detection circuit for detecting the desired wave (the Coriolis force). Therefore, there is a problem that the chip size grows to hinder the miniaturization and the reduction in cost of the product.

Figure 5:
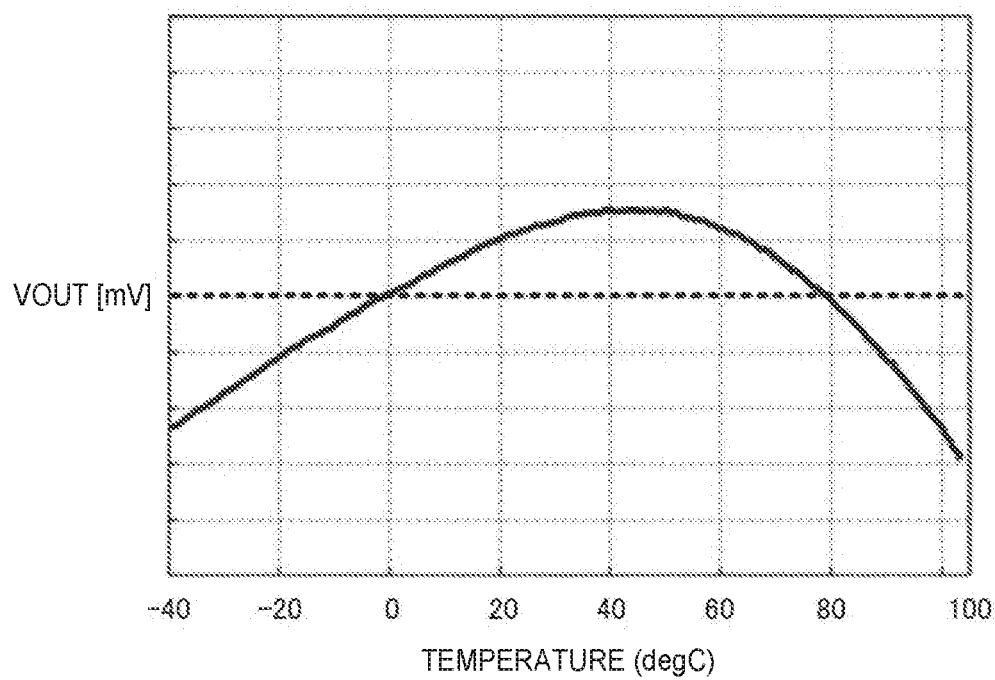
FIG. 5 is a diagram showing an example of the temperature characteristics of a sensor output voltage.

Further, if the vibration leakage component equal to or more than a predetermined amount is included in the detection signals S1, S2, the sensor output voltage VOUT varies with the temperature as shown in FIG. 5. Therefore, if the vibration leakage component is increased in order to increase the determination accuracy of the fault diagnosis, the temperature variation characteristic of the sensor output voltage VOUT becomes worse as shown in FIG. 5. It should be noted that the dotted line shown in FIG. 5 represents the temperature variation characteristic in the case in which the vibration leakage component is zero.

Figure 6:
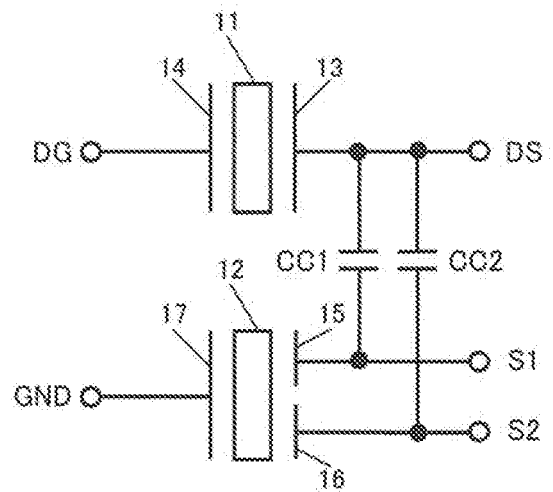
FIG. 6 is an explanatory diagram of a coupling capacitance formed between a drive electrode and a detection electrode.

Therefore, in the present embodiment, there is adopted a method of performing the fault diagnosis using the electrostatic leakage component caused by the coupling capacitances (the electrostatic coupling capacitances) between the drive electrode 13 and the detection electrodes 15, 16. As shown in, for example, FIG. 6, the coupling capacitance CC1 is formed between the drive electrode 13 supplied with the drive signal DS and the detection electrode 15 from which the detection signal S1 is output, and the coupling capacitance CC2 is formed between the drive electrode 13 and the detection electrode 16 from which the detection signal S2 is output. Taking FIG. 15 described later as an example, the coupling capacitance CC1 is a coupling capacitance (the electrostatic coupling capacitance) formed between a driving terminal 23 of the drive electrode 13 and a detecting terminal 25 of the detection electrode 15. The coupling capacitance CC2 is a coupling capacitance (the electrostatic coupling capacitance) formed between the driving terminal 23 of the drive electrode 13 and a detecting terminal 26 of the detection electrode 16. As described above, the coupling capacitances CC1, CC2 are formed due to the physical structure of the electrodes, and the electrostatic leakage component due to the coupling capacitances CC1, CC2 appears in the detection signals S1, S2. Specifically, as indicated by the symbols A1, A2 shown in FIG. 3, the steps in the voltage level due to the electrostatic leakage component occur. In the present embodiment, the steps in the voltage level indicated by the symbols A1, A2 are used for the fault diagnosis.

Specifically, as shown in FIG. 1 and FIG. 2, the physical quantity measurement device 5 according to the present embodiment includes the sensor element 10 having the drive electrode 13 and the detection electrodes 15, 16, and having the coupling capacitances (CC1, CC2) formed between the drive electrode 13 and the detection electrodes 15, 16, and the circuit device 20. The circuit device 20 includes the drive circuit 30 for supplying the drive electrode 13 with the drive signal DS, the detection circuit for detecting the physical quantity information corresponding to the physical quantity based on the detection signals S1, S2 from the detection electrodes 15, 16, and the fault diagnosis circuit 150. The fault diagnosis circuit 150 has the electrostatic leakage component extraction circuit 152 for extracting the electrostatic leakage component due to the coupling capacitances (CC1, CC2) from the detection signals S1, S2 or the amplified signals SA1, SA2 of the detection signals S1, S2 as the signals on which the synchronous detection has not been performed. Then, the fault diagnosis circuit 150 performs the fault diagnosis based on the electrostatic leakage component thus extracted. Specifically, such electrostatic leakage component as indicated by the symbols A1, A2 shown in FIG. 3 is extracted to make the fault diagnosis with respect to the physical quantity measurement device 5.

As described above, in the present embodiment, the electrostatic leakage component caused by the coupling capacitances between the drive electrode 13 and the detection electrodes 15, 16 is used as the fault diagnosis signal. The electrostatic leakage component corresponds to the coupling capacitances uniquely determined from the structure of the drive electrode 13 and the detection electrodes 15, 16, and therefore becomes difficult to be affected by the individual variation of the sensor element 10, and thus, it is possible to increase the determination accuracy of the fault diagnosis.

Further, according to the present embodiment, since it is not necessary to use the vibration leakage component in the fault diagnosis, it becomes possible to approximate the vibration leakage component to zero to obtain the sensor output (VOUT) having an ideal temperature variation characteristic represented by the dotted line shown in FIG. 5. Therefore, compared to the method of the related art example in which the vibration leakage component is used for the fault diagnosis, it is possible to reduce the variation of the sensor output with respect to the temperature variation. Thus, the highly accurate detection of the physical quantity such as an angular velocity becomes possible even in the case in which the operating temperature range is broad.

Further, since the fault diagnosis circuit 150 performs the fault diagnosis using the detection signals S1, S2 or the amplified signals SA1, SA2 of the detection signals S1, S2 as the signals on which the synchronous detection has not been performed, it is possible to realize the fault diagnosis with the fault diagnosis circuit 150 having a small-scale and simplified circuit configuration. For example, it becomes unnecessary to provide such a synchronous detection circuit for the fault diagnosis as used in the related art example. Therefore, it is possible to achieve the miniaturization of the chip size of the circuit device 20, the miniaturization of the product of the physical quantity measurement device 5, the cost reduction of the physical quantity measurement device 5 and the circuit device 20, and so on.

Further, in the present embodiment, the drive circuit 30 outputs the drive signal DS as a rectangular wave, and the electrostatic leakage component extraction circuit 152 extracts the changes in the detection signals S1, S2 or the amplified signals SA1, SA2 due to the rising edge or the falling edge of the drive signal DS as a rectangular wave as the electrostatic leakage component. For example, as indicated by the symbols A1, A2 shown in FIG. 3, the voltage changes of the amplified signals SA1, SA1 at the timing TM of the rising edge (the falling edge) of the drive signal DS are extracted as the electrostatic leakage component to perform the fault diagnosis. By performing driving with the drive signal DS as a rectangular wave as described above, the variation width of the steps in the voltage level due to the electrostatic leakage component can be made large as indicated by the symbols A1, A2 shown in FIG. 3. Therefore, it becomes possible to improve the determination accuracy of the fault diagnosis compared to the case of, for example, using the drive signal DS as a sinusoidal wave.

Further, in the present embodiment, the electrostatic leakage component extraction circuit 152 has the differentiation circuits 154, 156 to which the detection signals S1, S2 or the amplified signals SA1, SA2 of the detection signals S1, S2 are input, and extracts the electrostatic leakage component using the differentiation circuits 154, 156. By using such differentiation circuits 154, 156, it becomes possible to extract the electrostatic leakage component corresponding to the steps indicated by the symbols A1, A2 shown in FIG. 3 as the pulse signals PL1, PL2 shown in FIG. 4. In other words, it becomes possible to extract the pulse signals PL1, PL2 appearing in the output signals QA1, QA2 of the differentiation circuits 154, 156 as the electrostatic leakage component. Therefore, by using the pulse signals PL1, PL2, it becomes possible to realize the fault diagnosis high in determination accuracy.

Further, in the present embodiment, as shown in FIG. 2, the fault diagnosis circuit 150 has the crest value conversion circuit 160 for converting the crest values WH1, WH2 of the pulse signals PL1, PL2 of the output signals QA1, QA2 of the differentiation circuits 154, 156 to output the conversion voltage QD, and the determination circuit 180 for making the comparative determination between the conversion voltage QD from the crest value conversion circuit 160 and the threshold voltage to make the determination of the fault diagnosis. According to this configuration, it becomes possible to realize the fault diagnosis using a simplified determination process of converting the crest values WH1, WH2 of the pulse signals PL1, PL2 corresponding to the electrostatic leakage component into the conversion voltage QD, and then comparing the conversion voltage QD and the threshold voltage with each other. For example, if there occurs a fault such as an occurrence of breaking (breaking of the interconnections of the signals S1, S2, DG, and DS) of the signal interconnections in the detection channel or the drive channel or a failure in the electrodes (the detection electrode, the drive electrodes), or an occurrence of a failure in the circuits (the detection circuit, the drive circuit), the electrostatic leakage component disappears, the crest values WH1, WH2 of the pulse signals PL1, PL2 decrease, and the conversion voltage QD also lowers. Therefore, by the determination circuit 180 detecting the fact that, for example, the conversion voltage QD has become lower than the threshold voltage, it becomes possible to appropriately detect the occurrence of the fault.

Further, in the present embodiment, the fault diagnosis circuit 150 performs the fault diagnosis during the detection period in which the detection circuit 60 detects the physical quantity information. During the detection period in which the detection circuit 60 is normally detecting the physical quantity information such as an angular velocity, the fault diagnosis circuit 150 performs the fault detection using the electrostatic leakage component of the detection signals S1, S2. Thus, it becomes possible to perform the fault diagnosis not only in, for example, the startup period of the sensor element 10 (the vibrator element), but also in the normal measurement period. Therefore, it is possible to realize a constant fault diagnosis of constantly checking whether or not the physical quantity measurement device 5 (the detection circuit 60, the drive circuit 30) is operating normally. As a result, it becomes possible to constantly make the fault diagnosis in the normal operation of the physical quantity measurement device 5, and therefore, it becomes possible to achieve an improvement in reliability and so on.

Further, in the present embodiment, the detection signal S1 (the first detection signal) and the detection signal S2 (the second detection signal) are input to the detection circuit 60. For example, the detection signal S1 is input from the detection electrode 15, and the detection signal S2 is input from the detection electrode 16. Further, the fault diagnosis circuit 150 makes the fault diagnosis based on the detection signals S1, S2 or the amplified signals SA1, SA2 of the detection signals S1, S2. According to this process, in the case in which the detection signals from the sensor element 10 are the detection signals S1, S2 constituting the differential signals, it becomes possible to make the fault diagnosis in the detection channels of these differential signals. It becomes possible to appropriately detect the occurrence of the fault not only in the case in which, for example, the fault occurs in both of the detection channels of the detection signals S1, S2, but also in the case in which the fault occurs only in one of the detection channels of the detection signals S1, S2.

Further, in the present embodiment, the detection circuit 60 includes the Q-V conversion circuit 64 (the first charge-voltage conversion circuit) for amplifying the detection signal S1 to output the amplified signal SA1 (a first amplified signal) and the Q-V conversion circuit 66 (the second charge-voltage conversion circuit) for amplifying the detection signal S2 to output the amplified signal SA2 (a second amplified signal). Then, the electrostatic leakage component extraction circuit 152 extracts the electrostatic leakage component of the amplified signals SA1, SA2 from the Q-V conversion circuits 64, 66. By using the amplified signals SA1, SA2 as described above, it becomes possible to extract the leakage component in the state in which the electrostatic leakage component is amplified compared to the case of using the detection signals S1, S2. For example, it becomes possible to extract the voltage changes of the large steps indicated by the symbols A1, A2 shown in FIG. 3 as the electrostatic leakage component, and it is possible to achieve an improvement in the determination accuracy of the fault diagnosis.

2. Detailed Configuration Example, Modified Examples

Figure 7:
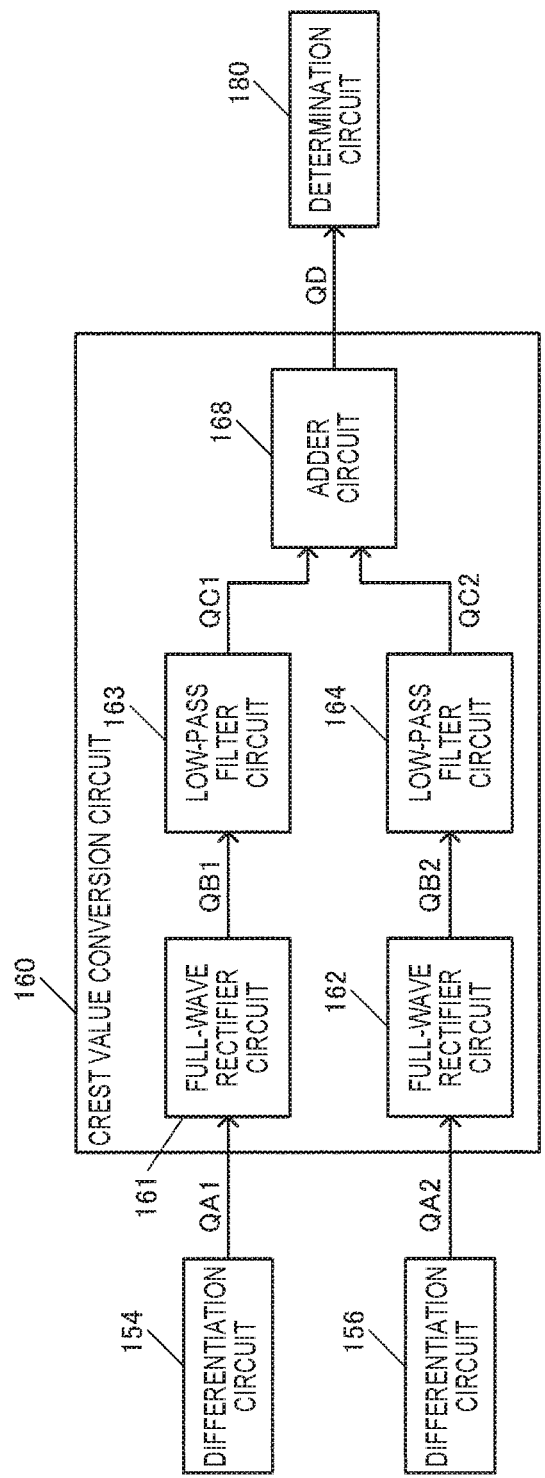
FIG. 7 is a diagram showing a configuration example of a crest value conversion circuit.

FIG. 7 shows a detailed configuration example of the crest value conversion circuit 160. Further, FIG. 8, FIG. 9, FIG. 10, and FIG. 11 each show a signal waveform example for explaining the operation of the crest value conversion circuit 160.

Figure 8:
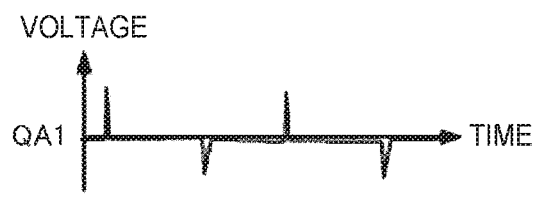
FIG. 8 is a signal waveform chart for explaining an operation of the crest value conversion circuit.
Figure 8:
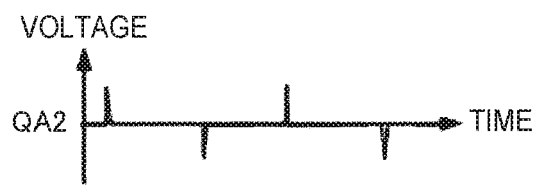
Figure 9:
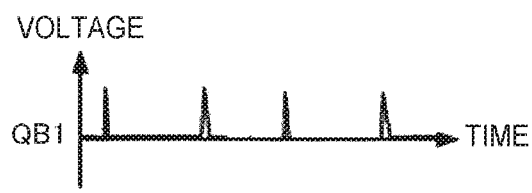
FIG. 9 is a signal waveform chart for explaining an operation of the crest value conversion circuit.
Figure 9:
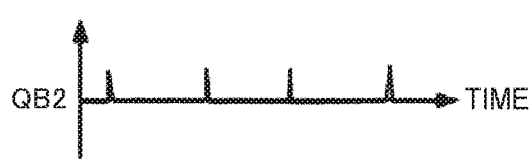
Figure 10:
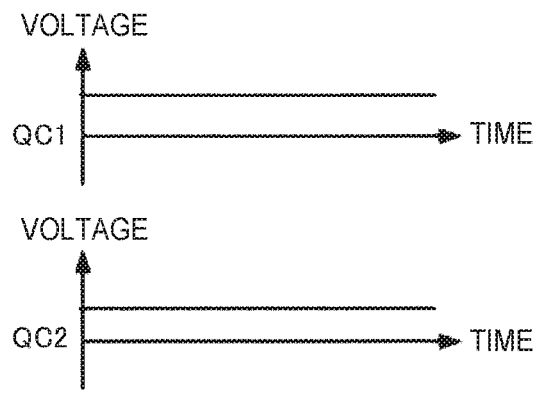
FIG. 10 is a signal waveform chart for explaining an operation of the crest value conversion circuit.
Figure 11:
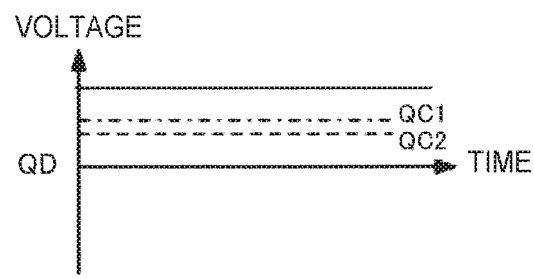
FIG. 11 is a signal waveform chart for explaining an operation of the crest value conversion circuit.

The crest value conversion circuit 160 shown in FIG. 7 includes full-wave rectifier circuits 161, 162, low-pass filter circuits 163, 164, and an adder circuit 168. As shown in FIG. 8, pulse signals are output from the differentiation circuits 154, 156 as the output signals QA1, QA2. The full-wave rectifier circuits 161, 162 each perform a process of obtaining the absolute value of the pulse signal in upward or downward direction (the positive direction or the negative direction) output from corresponding one of the differentiation circuits 154, 156 to uniform the pulse generation direction as shown in FIG. 9. As shown in FIG. 10, the low-pass filter circuits 163, 164 smooth output signals QB1, QB2 of the full-wave rectifier circuits 161, 162 with a given time constant to convert the output signals QB1, QB2 into DC signals QC1, QC2, respectively. In other words, the low-pass filter circuits 163, 164 convert the output signals QB1, QB2 into the DC signals QC1, QC2 (DC voltage levels) having voltage levels proportional to the sizes (the crest values) of the pulse signals, and then output the result. As shown in FIG. 11, the adder circuit 168 adds the DC signals QC1, QC2 output from the low-pass filter circuits 163, 164.

For example, it is assumed that the voltage levels of the DC signals QC1, QC2 output by the low-pass filter circuits 163, 164 are 2.5 V and 2.0 V, respectively. In this case, the adder circuit 168 outputs 4.5 V, which is the additional value of 2.5 V and 2.0 V, as the conversion voltage QD of the crest value conversion circuit 160. Here, it is assumed that the threshold value used by the determination circuit 180 for the determination on the fault diagnosis has been set to 3.0 V. In this case, since the conversion voltage QD (the additional value) output from the crest value conversion circuit 160 (the adder circuit 168) is 4.5 V, the determination circuit 180 determines that no fault has occurred, and therefore, the device is in the normal state. In contrast, in the case in which a fault exists in the channel on the detection signal S1 side or the channel on the detection signal S2 side, the conversion voltage QD becomes equal to or lower than 3.0 V, namely equal to or lower than the threshold voltage, the determination circuit 180 determines that a fault exists. By using the conversion voltage QD corresponding to the crest value as described above, the appropriate fault diagnosis high in determination accuracy becomes possible.

Figure 12:
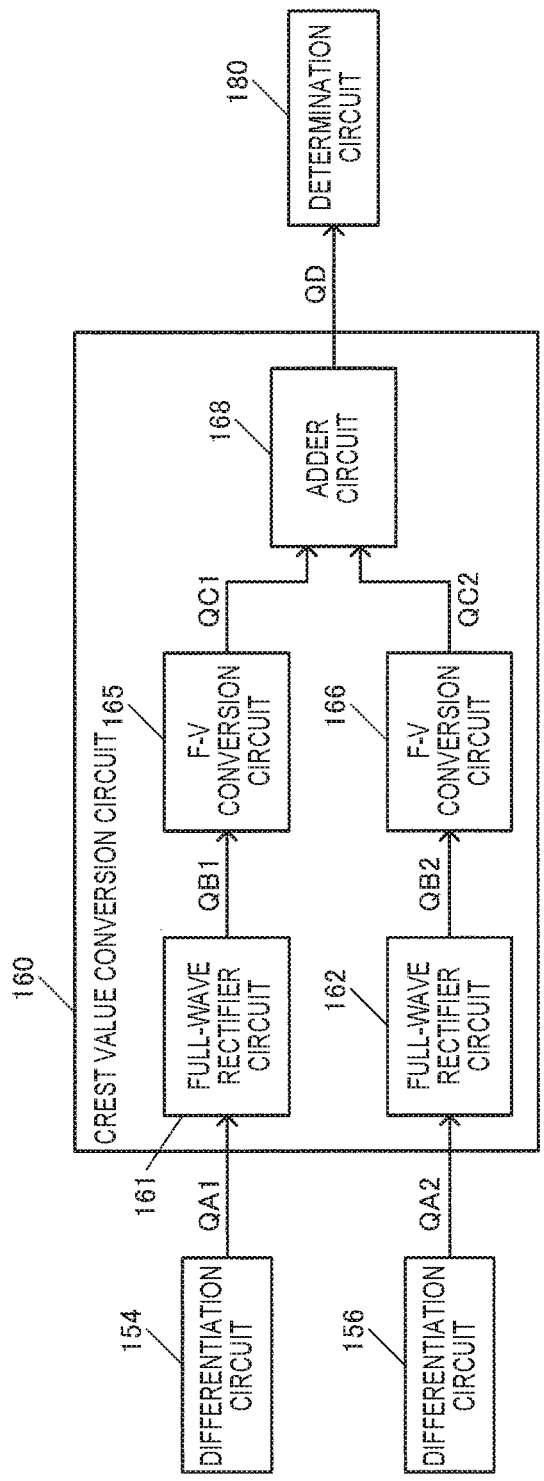
FIG. 12 is a diagram showing another configuration example of the crest value conversion circuit.

FIG. 12 shows another configuration example of the crest value conversion circuit 160. In FIG. 12, F-V conversion circuits 165, 166 for converting a frequency into a voltage are provided instead of the low-pass filter circuits 163, 164 shown in FIG. 7. The signal waveforms of the signals QA1, QA2, QB1, QB2, QC1, QC2, and QD become substantially the same as those shown in FIG. 8 through FIG. 11.

Figure 13:
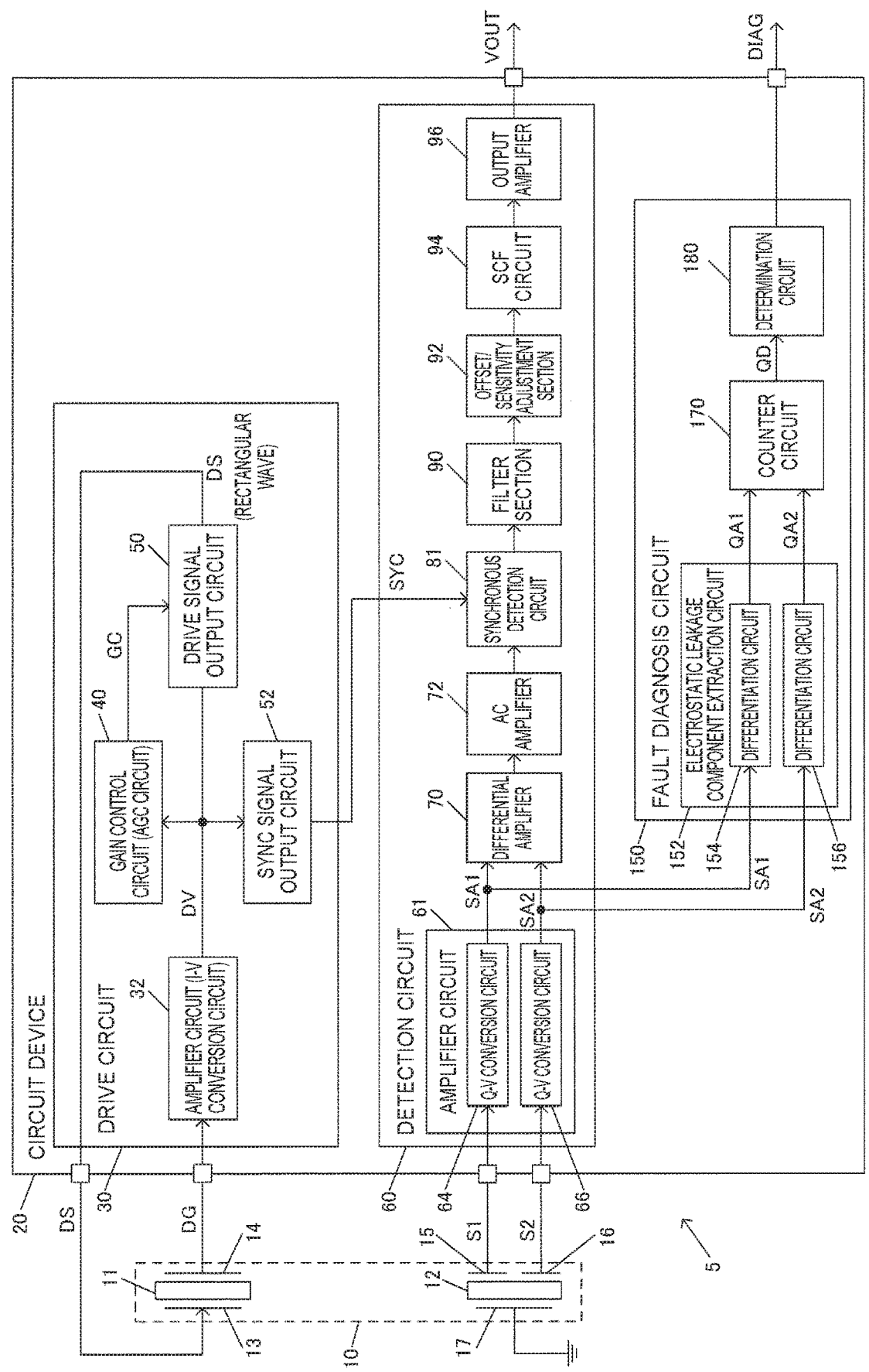
FIG. 13 is a diagram showing another configuration example of the physical quantity measurement device.

FIG. 13 shows a second configuration example of the physical quantity measurement device 5. In FIG. 13, the configuration of the fault diagnosis circuit 150 is different compared to the configuration example shown in FIG. 1. Specifically, the fault diagnosis circuit 150 shown in FIG. 13 includes the electrostatic leakage component extraction circuit 152, a counter circuit 170, and the determination circuit 180.

The electrostatic leakage component extraction circuit 152 includes the differentiation circuits 154, 156. The differentiation circuits 154, 156 output such output signals QA1, QA2 as shown in FIG. 8. The counter circuit 170 performs a count process of the pulse signals as the output signals QA1, QA2 of the differentiation circuits 154, 156. Specifically, the counter circuit 170 performs the count process for counting the number of pulses of the pulse signal to increment the count value. Then, the determination circuit 180 makes the determination of the fault diagnosis based on the count value of the counter circuit 170. By, for example, comparing the count value in the determination period with a predetermined number to be the threshold value, the determination circuit 180 makes the determination of the fault diagnosis.

If there occurs a fault such as breaking of the signal interconnections in the detection channel and the drive channel, an occurrence of a failure of the electrodes, or an occurrence of a failure of the circuits, the electrostatic leakage component disappears, and the pulse signals of the output signals QA1, QA2 of the differentiation circuits 154, 156 also stop occurring. Therefore, it becomes possible to detect an occurrence of a fault by the determination circuit 180 detecting the fact that, for example, the count value (the number of pulses of the pulse signal) of the counter circuit 170 in the determination period has become equal to or smaller than a predetermined number as the threshold value.

Figure 14:
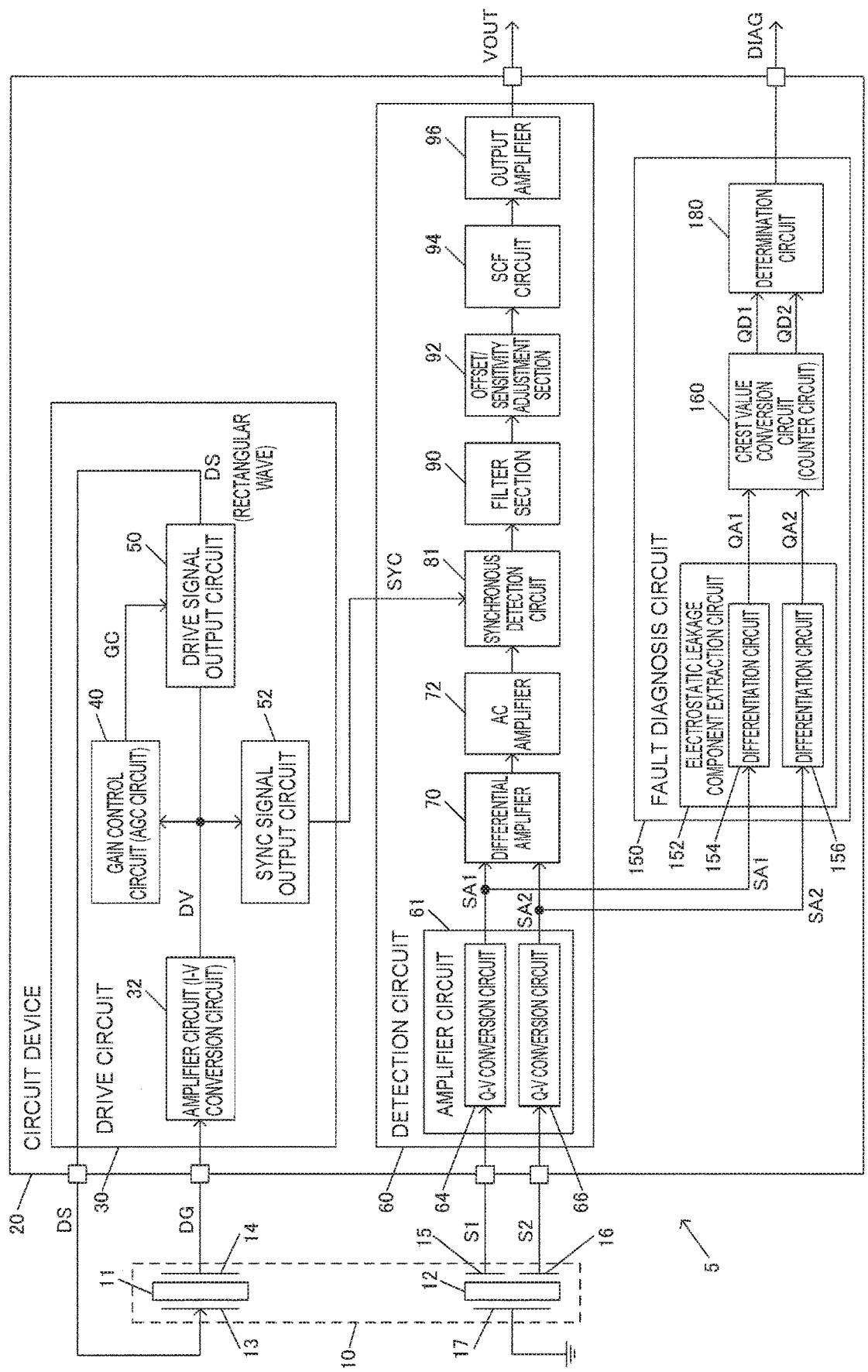
FIG. 14 is a diagram showing another configuration example of the physical quantity measurement device.

FIG. 14 shows another configuration example of the physical quantity measurement device 5. In FIG. 14, the output signals QD1, QD2 (the conversion voltage, the count value) from the crest value conversion circuit 160 (or the counter circuit 170 shown in FIG. 13) are input to the determination circuit 180. Then, the determination circuit 180 makes the determination of the fault diagnosis based on these output signals QD1, QD2. For example, the output signal QD1 is a signal corresponding to the electrostatic leakage component due to the coupling capacitance between the drive electrode 13 and the detection electrode 15, and the output signal QD2 is a signal corresponding to the electrostatic leakage component due to the coupling capacitance between the drive electrode 13 and the detection electrode 16. Therefore, since it becomes possible to make the fault diagnosis discriminating the detection electrode from the detection electrode 16 by the determination circuit 180 making the determination of the fault diagnosis based on each of the output signals QD1, QD2, it becomes possible to realize a more careful determination process of the fault diagnosis.

3. Sensor Element

Figure 15:
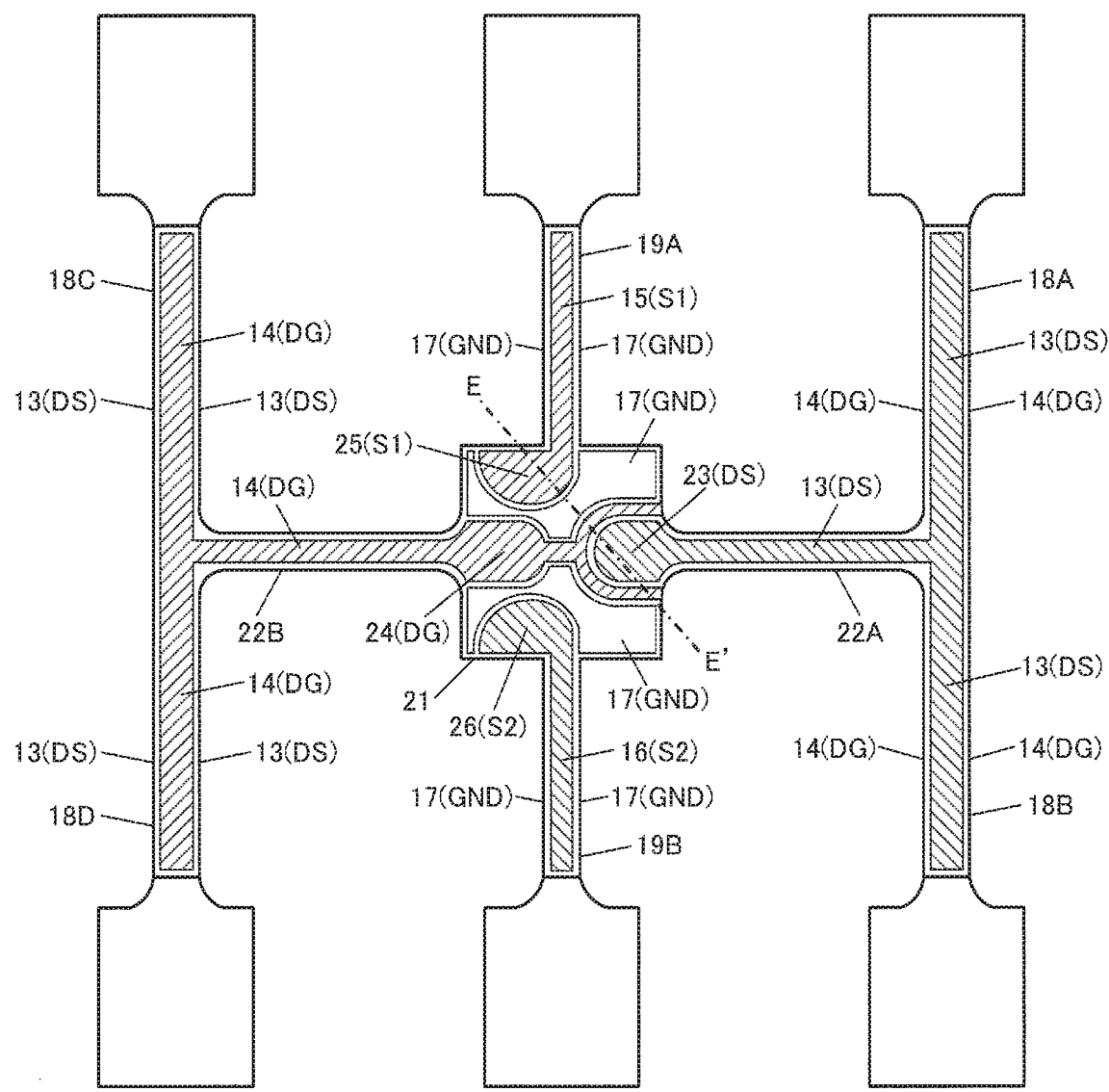
FIG. 15 is a diagram showing a configuration example of a sensor element.

FIG. 15 shows an example of a configuration of the sensor element 10. FIG. 15 shows an example of a double T-shaped gyro sensor element.

The sensor element 10 has the drive arms 18A, 18B, 18C, and 18D, the detection arms 19A, 19B, a base section 21, and connection arms 22A, 22B. The detection arms 19A, 19B extend in the +Y-axis direction and the −Y-axis direction with respect to the base section 21 having a rectangular shape, respectively. Further, the connection arms 22A, 22B extend in the +X-axis direction and the −X-axis direction with respect to the base section 21, respectively. Further, the drive arms 18A, 18B extend from a tip part of the connection arm 22A in the +Y-axis direction and the −Y-axis direction, respectively, and the drive arms 18C, 18D extend from a tip part of the connection arm 22B in the +Y-axis direction and the −Y-axis direction, respectively. A hammerhead part disposed on a tip side of each of the drive arms 18A, 18B, 18C, and 18D and the detection arms 19A, 19B is used as, for example, a weight for a frequency adjustment. Defining the Z axis as a thickness direction of the sensor element 10, the sensor element 10 as the gyro sensor element detects an angular velocity around the Z axis. The X axis and the Y axis are coordinate axes perpendicular to the Z axis, and the X axis and the Y axis are perpendicular to each other. The vibrator element of the sensor element 10 can be formed of a piezoelectric material such as quartz crystal, lithium tantalate, or lithium niobate. Among these materials, the quartz crystal is preferably used as the constituent material of the vibrator element. The X axis, the Y axis, and the Z axis are also called the electrical axis, the mechanical axis, and the optical axis of a quartz crystal substrate, respectively. The quartz crystal substrate is formed of a Z-cut quartz crystal plate shaped like a plate having a thickness in the Z-axis direction.

The drive electrode 13 is formed on an upper surface and a lower surface of each of the drive arms 18A, 18B, and the drive electrode 14 is formed on a right side surface and a left side surface of each of the drive arms 18A, 18B. The drive electrode 14 is formed on an upper surface and a lower surface of each of the drive arms 18C, 18D, and the drive electrode 13 is formed on a right side surface and a left side surface of each of the drive arms 18C, 18D. Further, the drive signal DS from the drive circuit 30 is supplied to the drive electrode 13, and the feedback signal DG from the drive electrode 14 is input to the drive circuit 30.

The detection electrode 15 is formed on an upper surface and a lower surface of the detection arm 19A, and the ground electrode 17 is formed on a right side surface and a left side surface of the detection arm 19A. The detection electrode 16 is formed on an upper surface and a lower surface of the detection arm 19B, and the ground electrode 17 is formed on a right side surface and a left side surface of the detection arm 19B. Further, the detection signals S1, S2 from the detection electrodes 15, 16 are input to the detection circuit 60.

It should be noted that a groove section (not shown) for enhancing the electrical field effect between the electrodes is provided to each of the upper surface and the lower surface of each of the drive arms 18A, 18B, 18C, and 18D and the detection arms 19A, 19B. By providing the groove sections, it becomes possible to generate a relatively large amount of charge with a relatively small amount of distortion. Further, the upper surfaces are each a surface on the +Z-axis direction side (the positive direction side of the Z axis), and the lower surfaces are each a surface on the −Z-axis direction side (the negative direction side of the Z axis). The right side surfaces are each a side surface on the +X-axis direction side (the positive direction side of the X axis), and the left side surfaces are each a side surface on the −X-axis direction side (the negative direction side of the X axis).

The driving terminals 23, 24 and the detecting terminals 25, 26 are provided to the base section 21. The ground electrode 17 is formed between these terminals. The drive signal DS from the drive circuit 30 is input to the driving terminal 23, and the feedback signal DG to the drive circuit 30 is output from the driving terminal 24. The detection signal S1 to the detection circuit 60 is output from the detecting terminal 25, and the detection signal S2 to the detection circuit 60 is output from the detecting terminal 26.

For example, first and second electrode leads (not shown) are connected to the driving terminals 23, 24. Further, the drive signal DS is supplied from the drive circuit 30 via the first electrode lead, and the feedback signal DG is output to the drive circuit 30 via the second electrode lead. Further, third and fourth electrode leads (not shown) are connected to the detecting terminals 25, 26. Further, the detection signals S1, S2 are output to the detection circuit 60 via the third and fourth electrode leads.

It should be noted that the drive electrodes of the sensor element 10 shown in FIG. 15 include the drive electrodes 13, 14 provided to the drive arms 18A through 18D and the driving interconnections connected to those drive electrodes 13, 14. The driving interconnections include the drive electrodes 13, 14 formed (disposed) on the connection arms 22A, 22B, the driving terminals 23, 24 formed (disposed) on the base section 21, and the drive electrodes 13, 14 formed (disposed) on connection sections of the drive arms 18A through 18D with the connection arms. It should be noted that the present embodiment is not limited to the example of the drive electrodes 13, 14 and the driving terminals 23, 24 shown in FIG. 15. Further, the detection electrodes of the sensor element 10 shown in FIG. 15 include the detection electrodes 15, 16 provided to the detection arms 19A, 19B and the detecting interconnections connected to those detection electrodes 15, 16. The detecting interconnections include the detecting terminals 25, 26 formed (disposed) on the base section 21, and the detection electrodes 15, 16 formed (disposed) on connection sections of the detection arms 19A, 19B with the base section. It should be noted that the present embodiment is not limited to the example of the detection electrodes 15, 16 and the detecting terminals 25, 26 shown in FIG. 15. Further, in the case of the sensor element 10 shown in FIG. 15, it is conceivable that the coupling capacitances generated between the driving terminal 23 provided to the base section 21 and the detecting terminals 25, 26 make a contribution to the coupling capacitances CC1, CC2 (the electrostatic coupling capacitances) described with reference to FIG. 6.

Figure 16:
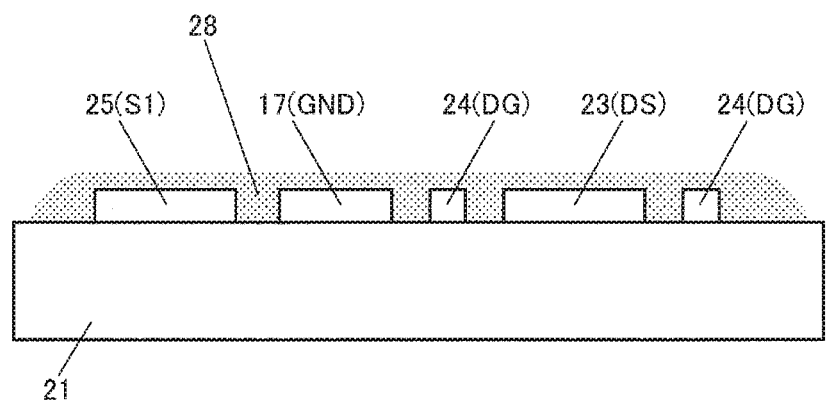
FIG. 16 is an explanatory diagram of a method of disposing a dielectric body so as to cover a driving terminal and a detecting terminal.

FIG. 16 is a cross-sectional view along the E-E' line shown in FIG. 15. The driving terminals 23, 24 and the detecting terminals 25 (the detecting terminal 26) are provided to the base section 21. Further, the ground electrode 17 is also formed. Further, a dielectric body 28 is formed so as to cover the driving terminals 23, 24, the detecting terminal 25 and so on. For example, the dielectric body 28 (an insulating body) as an insulating material is formed.

As described above, in the present embodiment, the sensor element 10 includes the base section 21, the drive arms 18A, 18B, 18C, and 18D and the detection arms 19A, 19B. Further, the base section 21 is provided with the driving terminals 23, 24 and the detecting terminals 25, 26, and the dielectric body 28 is disposed so as to cover the driving terminals 23, 24 and the detecting terminals 25, 26 of the base section 21. By applying the insulating material such as polyimide, the dielectric body 28 is formed. According to this configuration, it becomes possible to increase the capacitance values of the coupling capacitances CC1, CC2 (the electrostatic coupling capacitances) described with reference to FIG. 6 as much as an amount corresponding to the dielectric constant ca of the insulating material compared to the case in which the insulating material is not applied. It should be noted that it is also possible to adjust the coupling capacitances CC1, CC2 to the desired capacitance values by adjusting the amount of the insulating body between the electrodes using a trimming technology.

For example, although the electrostatic leakage component described above is a value based on the coupling capacitance uniquely determined from the structure of the drive electrodes and the detection electrodes, by applying the insulating material such as polyimide to the surface (the front surface of the base section 21) of the sensor element 10, it is possible to increase the capacitance value of the coupling capacitance. Thus, it is possible to increase the electrostatic leakage component corresponding to the changes in voltage level indicated by the symbols A1, A2 shown in FIG. 3. Therefore, it becomes possible to sensitively detect the electrostatic leakage component, and thus, it becomes possible to realize the fault diagnosis high in determination accuracy. It should be noted that the sensor element 10 can also be provided with a structure of being supported above the circuit device 20 in the package of the physical quantity measurement device 5 using the electrode leads connected to the driving terminals 23, 24 and the detecting terminals 25, 26 as supporting sections. In this case, an opening is provided to the part corresponding to each of the driving terminals 23, 24 and the detecting terminals 25, 26 to connect one end of each of the electrode lead to the opening. It is also possible to connect the electrode leads using conductive bumps such as metal bumps.

Figure 17:
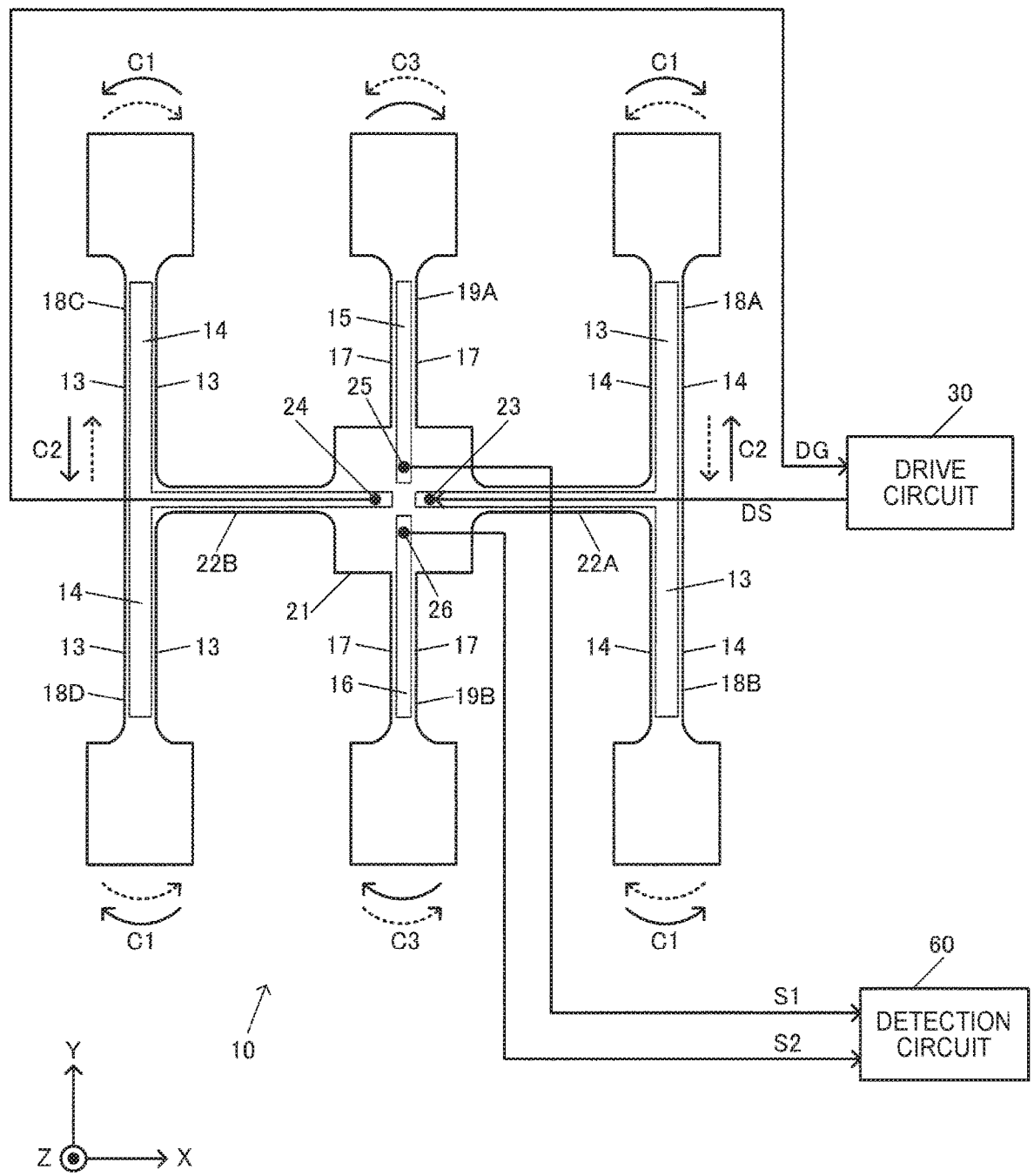
FIG. 17 is an explanatory diagram of an operation of the sensor element.

FIG. 17 is a diagram for schematically explaining an operation of the sensor element 10. By the sensor element as an angular velocity sensor, the angular velocity around the Z axis is detected.

When the drive signal DS is applied by the drive circuit 30 to the drive electrode 13, the drive arms 18A, 18B, 18C, and 18D perform a flexural vibration (an excitation vibration) as indicated by the arrows C1 shown in FIG. 17 due to the inverse piezoelectric effect. For example, the vibrational posture represented by the solid arrows and the vibrational posture represented by the dotted arrows are repeated at a predetermined frequency. In other words, there is performed the flexural vibration in which the tips of the drive arms 18A, 18C repeat coming closer to and getting away from each other, and the tips of the drive arms 18B, 18D also repeat coming closer to and getting away from each other. On this occasion, since the pair of drive arms 18A and 18B and the pair of drive arms 18C and 18D respectively perform the vibrations line symmetric about the X axis passing through the centroid position of the base section 21, the base section 21, the connection arms 22A, 22B and the detection arms 19A, 19B hardly vibrate.

If the angular velocity having the Z axis as the rotational axis is applied to the sensor element 10 (if the sensor element 10 rotates around the Z axis) in this state, the drive arms 18A, 18B, 18C and 18D vibrate in such a manner as indicated by the arrows C2 due to the Coriolis force. In other words, by the Coriolis force in the direction of the arrows C2 perpendicular to the direction of the arrows C1 and the direction of the Z axis acting on the drive arms 18A, 18B, 18C, and 18D, the vibration component in the direction of the arrows C2 is generated. The vibration of the arrows C2 propagates to the base section 21 via the connection arms 22A, 22B, and thus, the detection arms 19A, 19B perform a flexural vibration in the direction of the arrows C3. A charge signal generated due to the piezoelectric effect by the flexural vibration of the detection arms 19A, 19B is input to the detection circuit 60 as the detection signals S1, S2, and thus, the angular velocity around the Z axis becomes to be detected.

For example, defining the angular velocity of the sensor element 10 around the Z axis as w, the mass as m, and the vibration velocity as v, the Coriolis force Fc is expressed as follows.

$$Fc = 2m \cdot v \cdot \omega$$

Therefore, by the detection circuit 60 detecting the desired signal as a signal corresponding to the Coriolis force, the angular velocity ω around the Z axis can be obtained.

4. Vehicle, Electronic Apparatus

Figure 18:
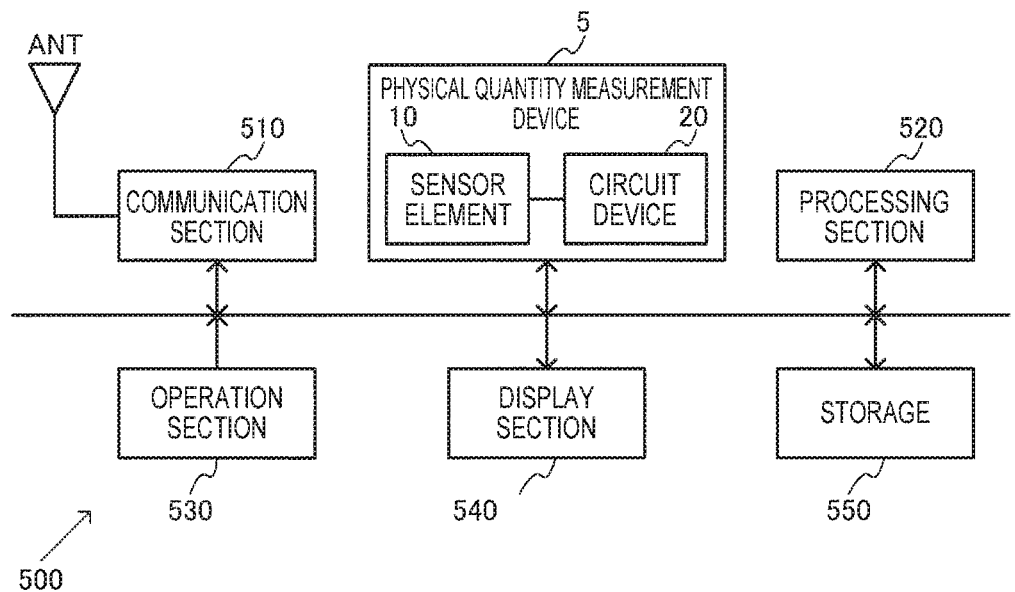
FIG. 18 is a diagram showing a configuration example of an electronic apparatus.

FIG. 18 shows a configuration example of an electronic apparatus 500 including the physical quantity measurement device 5 according to the present embodiment. The electronic apparatus 500 includes the physical quantity measurement device 5 having the sensor element 10 and the circuit device 20, and a processing section 520. Further, the electronic apparatus 500 can include a communication section 510, an operation section 530, a display section 540, a storage 550, and an antenna ANT.

The communication section 510 (a wireless circuit) performs a process of receiving data externally via the antenna ANT and transmitting data to the outside. The processing section 520 (processing circuit) performs a control process of the electronic apparatus 500, signal processing of the physical quantity information measured by the physical quantity measurement device 5, signal processing of the data transmitted or received via the communication section 510, and so on. The function of the processing section 520 can be realized by a processor such as a microcomputer. The operation section 530 is for the user to perform an input operation, and can be realized by operation buttons, a touch panel display, or the like. The display section 540 is for displaying a variety of types of information, and can be realized by a display using a liquid crystal, an organic EL, or the like. The storage 550 is for storing the data, and the function thereof can be realized by a semiconductor memory such as a RAM or a ROM, a hard disk drive (HDD), or the like.

The physical quantity measurement device 5 according to the present embodiment can be applied to a variety of electronic apparatuses such as a camera including a digital still camera or a video camera, on-vehicle equipment, wearable equipment, or a robot. For example, in the camera, it is possible to perform the image stabilization using the physical quantity measurement device 5. The on-vehicle equipment is an electronic apparatus installed in a car, a motorcycle, and so on, and is, for example, equipment for automated operation, navigation equipment, or on-vehicle communication equipment. The wearable equipment is the equipment to be worn by the user on the body, and is, for example, wrist type wearable equipment, a head-mounted display device, a pulse monitor, a pedometer, or a physical activity meter. For example, in the wearable equipment, it is possible to detect the body motion of the user or to detect an exercise condition using the physical quantity measurement device 5. Further, the physical quantity measurement device 5 can also be applied to a movable part (an arm, a joint) or a main body part of a robot. As the robot, it is possible to assume both of a vehicle (running/walking robot) and an electronic apparatus (non-running/non-walking robot). In the case of the running/walking robot, the physical quantity measurement device 5 according to the present embodiment can be used for, for example, autonomous running. Further, the physical quantity measurement device 5 according to the present embodiment can be applied to a variety of electronic apparatuses such as a portable information terminal (e.g., a smartphone), a printing device, a projection device, or a measurement instrument for measuring a physical quantity.

Figure 19:
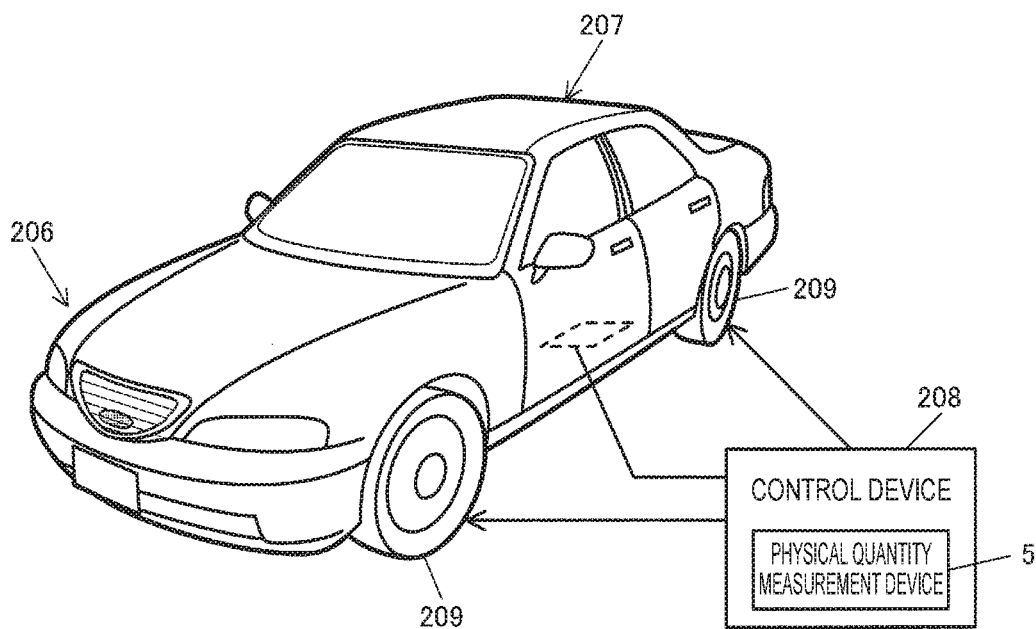
FIG. 19 is a diagram showing a configuration example of a vehicle.

FIG. 19 shows an example of a vehicle including the physical quantity measurement device 5 according to the present embodiment. The physical quantity measurement device 5 according to the present embodiment can be incorporated in a variety of vehicles such as a car, an airplane, a motorbike, a bicycle, a ship, or a boat. The vehicle is equipment or a device provided with a drive mechanism such as an engine or a motor, a steering mechanism such as a steering wheel or a helm, and a variety of electronic apparatuses, and moving on the ground, in the air, or on the sea. FIG. 19 schematically shows a car 206 as a specific example of the vehicle. The car 206 incorporates the physical quantity measurement device 5 including the sensor element 10 and the circuit device 20. The physical quantity measurement device 5 is capable of detecting the attitude of a car body 207. The physical quantity information such as the angular velocity measured by the physical quantity measurement device 5 is supplied to a control device 208 for performing the car body attitude control and so on. The control device 208 is capable of controlling, for example, the stiffness of the suspension, and controlling the brake of each of the wheels 209 in accordance with the attitude of the car body 207. Besides the above, such attitude control as described above can be used for a variety of vehicles such as a two-legged robot, an airplane, and a helicopter. In realizing the attitude control, the physical quantity measurement device 5 can be incorporated.

It should be noted that although the present embodiment is hereinabove described in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with a different term in any part of the specification or the accompanying drawings. Further, the configurations of the physical quantity measurement device, the circuit device, the sensor element, the electronic apparatus, and the vehicle are not limited to those described in the present embodiment, but can be implemented with a variety of modifications.

What is claimed is:

1. A physical quantity measurement device comprising:
    a sensor having a drive electrode and a detection electrode, and provided with a coupling capacitance formed between the drive electrode and the detection electrode; and
    a circuit device having a drive circuit adapted to supply a drive signal to the drive electrode, a detection circuit adapted to detect physical quantity information corresponding to a physical quantity based on a detection signal from the detection electrode, and a fault diagnosis circuit,
    wherein the fault diagnosis circuit has an electrostatic leakage component extraction circuit adapted to extract an electrostatic leakage component due to the coupling capacitance from one of the detection signal and an amplified signal of the detection signal, and performs a fault diagnosis based on the electrostatic leakage component extracted.

2. The physical quantity measurement device according to claim 1, wherein
    the drive circuit outputs the drive signal as a rectangular wave, and
    the electrostatic leakage component extraction circuit extracts a change of one of the detection signal and the amplified signal due to one of a rising edge and a falling edge of the drive signal as the rectangular wave as the electrostatic leakage component.

3. An electronic apparatus comprising: the physical quantity measurement device according to claim 2; and a processor configured to control the electronic apparatus in response to the physical quantity information detected by the physical quantity measurement device.

4. A vehicle comprising: the physical quantity measurement device according to claim 2; and a vehicle controller configured to control the vehicle in response to the physical quantity information detected by the physical quantity measurement device.

5. The physical quantity measurement device according to claim 1, wherein
    the electrostatic leakage component extraction circuit has a differentiation circuit to which one of the detection signal and the amplified signal is input, and extracts the electrostatic leakage component using the differentiation circuit.

6. The physical quantity measurement device according to claim 5, wherein
    the fault diagnosis circuit includes
        a crest value conversion circuit adapted to convert a crest value of a pulse signal as an output signal of the differentiation circuit to output a conversion voltage, and
        a determination circuit adapted to make a comparative determination between the conversion voltage from the crest value conversion circuit and a threshold voltage to make a determination of the fault diagnosis.

7. An electronic apparatus comprising: the physical quantity measurement device according to claim 6; and a processor configured to control the electronic apparatus in response to the physical quantity information detected by the physical quantity measurement device.

8. A vehicle comprising: the physical quantity measurement device according to claim 6; and a vehicle controller configured to control the vehicle in response to the physical quantity information detected by the physical quantity measurement device.

9. The physical quantity measurement device according to claim 5, wherein
    the fault diagnosis circuit includes
        a counter circuit adapted to perform a count process of the pulse signal as the output signal of the differentiation circuit, and
        a determination circuit adapted to make a determination of the fault diagnosis based on a count value of the counter circuit.

10. An electronic apparatus comprising: the physical quantity measurement device according to claim 9; and a processor configured to control the electronic apparatus in response to the physical quantity information detected by the physical quantity measurement device.

11. A vehicle comprising: the physical quantity measurement device according to claim 9; and a vehicle controller configured to control the vehicle in response to the physical quantity information detected by the physical quantity measurement device.

12. An electronic apparatus comprising: the physical quantity measurement device according to claim 5; and a processor configured to control the electronic apparatus in response to the physical quantity information detected by the physical quantity measurement device.

13. A vehicle comprising: the physical quantity measurement device according to claim 5; and a vehicle controller configured to control the vehicle in response to the physical quantity information detected by the physical quantity measurement device.

14. The physical quantity measurement device according to claim 1, wherein
the fault diagnosis circuit makes the fault diagnosis in a detection period in which the detection circuit detects the physical quantity information.

15. The physical quantity measurement device according to claim 1, wherein
the sensor includes a base, a drive arm and a detection arm,
the base is provided with a driving terminal and a detecting terminal, and
a dielectric body is disposed so as to cover the driving terminal and the detecting terminal of the base.

16. The physical quantity measurement device according to claim 1, wherein
a first detection signal and a second detection signal as the detection signal are input to the detection circuit, and
the fault diagnosis circuit performs the fault diagnosis based on one of the first and second detection signals and first and second amplified signals as amplified signals of the first and second detection signals.

17. The physical quantity measurement device according to claim 16, wherein
the detection circuit includes
a first charge-voltage conversion circuit adapted to amplify the first detection signal to output the first amplified signal, and
a second charge-voltage conversion circuit adapted to amplify the second detection signal to output the second amplified signal, and
the electrostatic leakage component extraction circuit extracts the electrostatic leakage component of the first and second amplified signals from the first and second charge-voltage conversion circuit.

18. The physical quantity measurement device according to claim 16, wherein
the detection circuit includes
a differential amplifier adapted to perform differential amplification of the first and second amplified signals input to the fault diagnosis circuit, and
a synchronous detection circuit adapted to perform synchronous detection based on a signal having been differentially amplified by the differential amplifier.

19. An electronic apparatus comprising: the physical quantity measurement device according to claim 1; and a processor configured to control the electronic apparatus in response to the physical quantity information detected by the physical quantity measurement device.

20. A vehicle comprising: the physical quantity measurement device according to claim 1; and a vehicle controller configured to control the vehicle in response to the physical quantity information detected by the physical quantity measurement device.

* * * * *